US012785689B2

(12) United States Patent
Lupino et al.

(10) Patent No.: US 12,785,689 B2
(45) Date of Patent: Nov. 3, 2026

(54) QUASI-ADIABATIC CIRCUITS

(71) Applicant: QAL Semiconductor, Inc., Minneapolis, MN (US)

(72) Inventors: James Lupino, St. Louis Park, MN (US); Tommy Allen Agan, Maple Grove, MN (US)

(73) Assignee: QAL Semiconductor, Inc., Minneapolis, MN (US)

( * ) Notice: Subject to any disclaimer, the term of this patent is extended or adjusted under 35 U.S.C. 154(b) by 0 days.

(21) Appl. No.: 19/637,633

(22) Filed: Apr. 2, 2026

(65) Prior Publication Data

US 2026/0238210 A1 Aug. 13, 2026

Related U.S. Application Data

(63) Continuation of application No. PCT/US2024/050179, filed on Oct. 7, 2024.

(60) Provisional application No. 63/783,011, filed on Apr. 3, 2025, provisional application No. 63/588,259, filed on Oct. 5, 2023.

(51) Int. Cl.
*H03K 19/00* (2006.01)

(52) U.S. Cl.
CPC ................................ *H03K 19/0019* (2013.01)

(58) Field of Classification Search
None
See application file for complete search history.

(56) References Cited

U.S. PATENT DOCUMENTS

| | | | |
|---|---|---|---|
| 5,357,548 | A | 10/1994 | Merkle |
| 5,378,940 | A | 1/1995 | Knight, Jr. et al. |
| 5,422,582 | A | 6/1995 | Avery et al. |
| 5,473,270 | A | 12/1995 | Denker |
| 5,477,164 | A | 12/1995 | Denker |
| 5,602,497 | A | 2/1997 | Thomas |
| 5,701,093 | A | 12/1997 | Suzuki |
| 5,838,203 | A | 11/1998 | Stamoulis et al. |
| 5,841,299 | A | 11/1998 | De |

(Continued)

FOREIGN PATENT DOCUMENTS

WO WO-2025076502 A1 4/2025

OTHER PUBLICATIONS

"International Application Serial No. PCT/US2024/050179, International Search Report mailed Dec. 12, 2024", 2 pgs.

(Continued)

*Primary Examiner* — Jany Richardson

(74) *Attorney, Agent, or Firm* — Schwegman Lundberg & Woessner, P.A.

(57) ABSTRACT

Apparatus and associated methods relate to a quasi-adiabatic circuit that includes a plurality of quasi-adiabatic logic gates daisy-chain connected in a phased sequence. Each of the quasi-adiabatic logic gates in the daisy-chained sequence has power nodes conductively coupled to one of a phased sequence of sinusoidal power signals. The sinusoidal power signal conductively coupled to each of the quasi-adiabatic logic gates is phase delayed from that of the sinusoidal power signal conductively coupled to its immediately preceding quasi-adiabatic logic gate in the daisy-chained sequence. The phase delay is equal to 360° divided by the number of sinusoidal power signals in the phase sequence of sinusoidal power signals.

20 Claims, 15 Drawing Sheets

(56) References Cited

U.S. PATENT DOCUMENTS

| | | | |
|---|---|---|---|
| 5,986,476 | A | 11/1999 | De |
| 6,316,962 | B1 | 11/2001 | Kwon |
| 6,407,587 | B1 | 6/2002 | Piguet |
| 6,438,422 | B1 | 8/2002 | Thompson et al. |
| 6,777,992 | B2 | 8/2004 | Ziesler et al. |
| 6,879,190 | B2 | 4/2005 | Kim et al. |
| 7,355,454 | B2 | 4/2008 | Papaefthymiou et al. |
| 7,746,117 | B2 | 6/2010 | Hong et al. |
| 7,902,861 | B2 | 3/2011 | Coenen |
| 8,450,991 | B2 | 5/2013 | Runas et al. |
| 8,907,638 | B2 | 12/2014 | Athas et al. |
| 9,276,579 | B2 | 3/2016 | Despont et al. |
| 9,431,910 | B1 | 8/2016 | Yang et al. |
| 9,455,702 | B2 | 9/2016 | Ungar et al. |
| 9,531,384 | B1 | 12/2016 | Morrison et al. |
| 10,319,422 | B2 | 6/2019 | Huffman |
| 10,367,376 | B2 | 7/2019 | Yang et al. |
| 10,510,399 | B2 | 12/2019 | Huffman |
| 10,817,463 | B1 | 10/2020 | Debenedictis |
| 11,206,021 | B2 | 12/2021 | Agan et al. |
| 11,488,660 | B2 | 11/2022 | Snider et al. |
| 11,784,648 | B2 | 10/2023 | Huffman |
| 12,021,522 | B2 | 6/2024 | Agan et al. |
| 2010/0073029 | A1 * | 3/2010 | Hong .................. H03K 19/096 326/98 |
| 2019/0392339 | A1 | 12/2019 | Leipold et al. |
| 2021/0265997 | A1 | 8/2021 | Agan et al. |
| 2021/0327496 | A1 * | 10/2021 | Snider ................ H03K 19/0019 |

OTHER PUBLICATIONS

"International Application Serial No. PCT/US2024/050179, Written Opinion mailed Dec. 12, 2024", 4 pgs.

* cited by examiner

QUASI-ADIABATIC CIRCUITS

CLAIM OF PRIORITY

This patent application claims the benefit of priority to Lupino et al., U.S. Patent Cooperation Treaty Application Serial Number PCT/US2024/050179, entitled "QUASI-ADIABATIC LOGIC," filed on Oct. 7, 2024, which claims priority to U.S. Patent Application Ser. No. 63/588,259, entitled "QUASI-ADIABATIC LOGIC," filed on Oct. 5, 2023, and to Lupino et al., U.S. Provisional Patent Application Ser. 63/783,011, entitled "QUASI-ADIABATIC CIRCUITS," filed on Apr. 3, 2025, each of which is hereby incorporated by reference herein in its entirety.

BACKGROUND

Conventional CMOS logic circuits are powered between two DC power buses. The CMOS logic circuits are configured to perform specific logic functions based on input signals received thereby. When the input signals change the output signal of the CMOS logic gate changes state. During the transition of the changing input signal, the CMOS logic gate can conduct a pulse of current of high peak magnitude. These pulses of current occur as a result of at least two different phenomena-crowbar current and capacitive charging. First, if both pullup and pulldown networks of a CMOS logic gate are on, at least partially, then these pullup and pulldown networks provide a path for current to flow directly from one supply to another supply. This phenomenon is termed "crowbar current." Second, every node that changes state requires that node's capacitance to be one or more of charged or discharged (e.g., depending on the polarity of the state change). Of these two phenomena, crowbar current is the most grievous, in that crowbar current serves no useful purpose. Unlike crowbar current, current that is used to charge parasitic capacitances of the subsequent logic gates serves to change the voltage of those nodes, which is needed to accomplish the logic function of the CMOS logic gate.

These pulses of current are undesirable for many reasons. First, they are a significant source of power consumption of CMOS logic gates. Second, pulses of current that charge the output node, especially those with high peak current magnitudes, can cause the supplies to momentarily collapse. Third, these pulses are sources of noise, which can cause errors in the function of the circuits that use such CMOS logic gates. Various adiabatic logic circuits have been proposed to address such problems associated with conventional CMOS logic gates. These adiabatic logic circuits have been shown to reduce the power consumption of logic circuitry, as well as reducing the magnitude of current pulses. Many of the proposed adiabatic logic techniques require reversible circuitry, which effectively doubles the number of transistors required to perform a logic function. This in turn reduces any power reduction and increases cost as die size increases. Reducing clock rates can further reduce power consumption, but such clock rate reduction can dramatically increase the cost of performing the calculations.

SUMMARY

Some embodiments relate to a quasi-adiabatic logic circuit that includes a sinusoidal power generating circuit and a plurality of quasi-adiabatic logic gates. The sinusoidal power generating circuit is configured to generate a plurality of sinusoidal power signals of a common frequency evenly phase distributed over 360° in a modulo phased sequence. Each of the plurality of sinusoidal power signals has a phase lagging the phase of a previous one of the modulo phased sequence and leading the phase of a following one of the modulo phased sequence by a delta phase angle $\Delta\theta$. The plurality of quasi-adiabatic logic gates are daisy-chain connected output-to-input. Each of the plurality of quasi-adiabatic logic gates is powered by a corresponding one of the plurality of sinusoidal power signals. Each of the plurality of quasi-adiabatic logic gates includes: i) one or more logic input terminals configured to receive one or more corresponding logic input signals; and ii) a logic output terminal configured to provide a logic output signal, wherein the logic output signal is characterized by the phase of the corresponding one of the plurality of sinusoidal power signals providing power thereto.

DETAILED DESCRIPTION

Apparatus and associated methods relate to a quasi-adiabatic circuit that includes a plurality of quasi-adiabatic logic gates daisy-chain connected in a phased sequence. Each of the quasi-adiabatic logic gates in the daisy-chained sequence has power nodes conductively coupled to one of a phased sequence of sinusoidal power signals. The sinusoidal power signal conductively coupled to each of the quasi-adiabatic logic gates is phase delayed from that of the sinusoidal power signal conductively coupled to its immediately preceding quasi-adiabatic logic gate in the daisy-chained sequence. The phase delay is equal to 360° divided by the number of sinusoidal power signals in the phase sequence of sinusoidal power signals.

Figure 1:
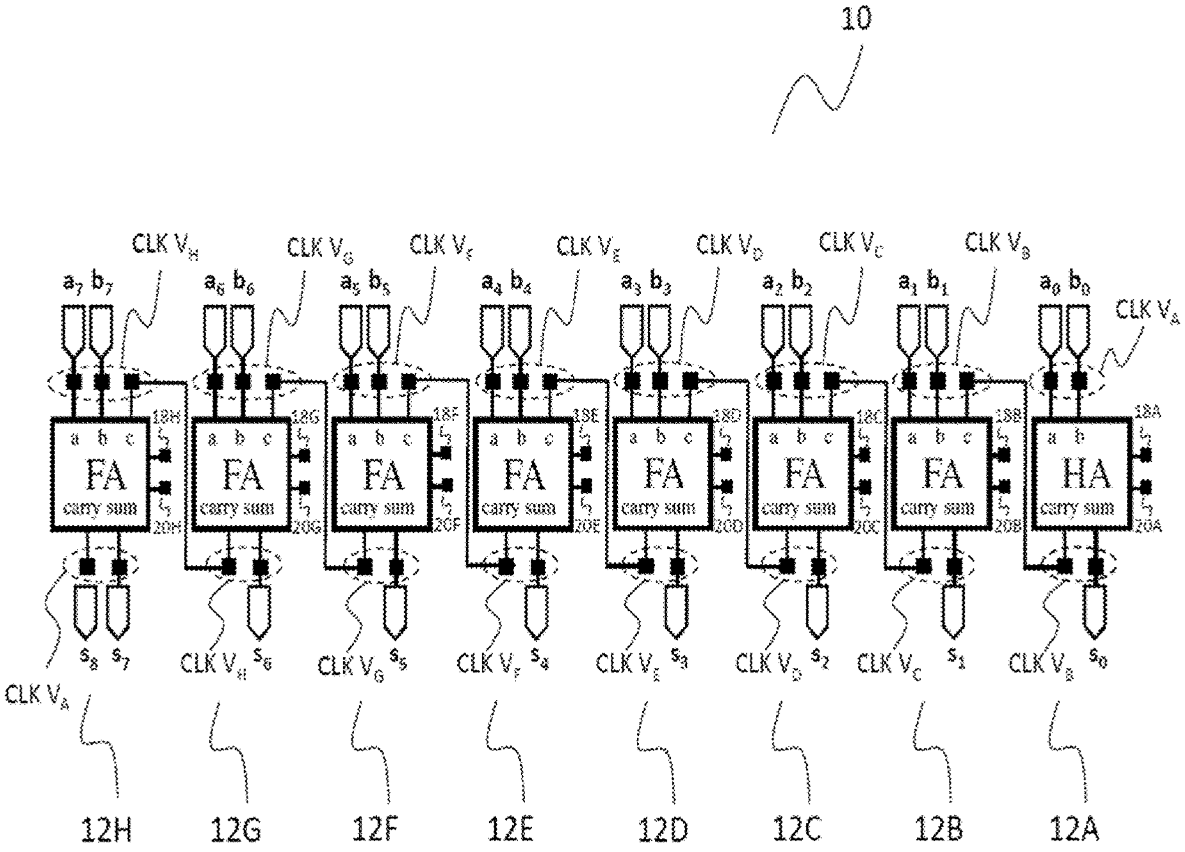
FIG. 1 is a schematic diagram of an example of a quasi-adiabatic logic circuit.

FIG. 1 is a schematic diagram of a quasi-adiabatic logic circuit. In FIG. 1, chain 10 of quasi-adiabatic logic gates 12A-12H are daisy-chain connected in a phased sequence, output-to-input, from first quasi-adiabatic logic gate 12A to last quasi-adiabatic logic gate 12H in the sequence. In the depicted embodiment, quasi-adiabatic logic circuit 10 is an eight-bit ripple carry adder. Quasi-adiabatic logic gate 12A is a half adder, and each of quasi-adiabatic logic gates 12B-12H is a full adder. Each of these quasi-adiabatic logic gates are daisy-chain connected from carry output terminal to carry input terminal. For example, the carry output terminal of quasi-adiabatic logic gate 12A is connected to the carry input terminal of quasi-adiabatic logic gate 12B. Similarly, the carry output terminal of quasi-adiabatic logic gate 12B is connected to the carry input terminal of quasi-adiabatic logic gate 12C. Such daisy chaining of quasi-adiabatic logic gates 12A-12H continues, ending with the carry output terminal of quasi-adiabatic logic gate 12G being connected to the carry input terminal of quasi-adiabatic logic gate 12H.

Figure 2:
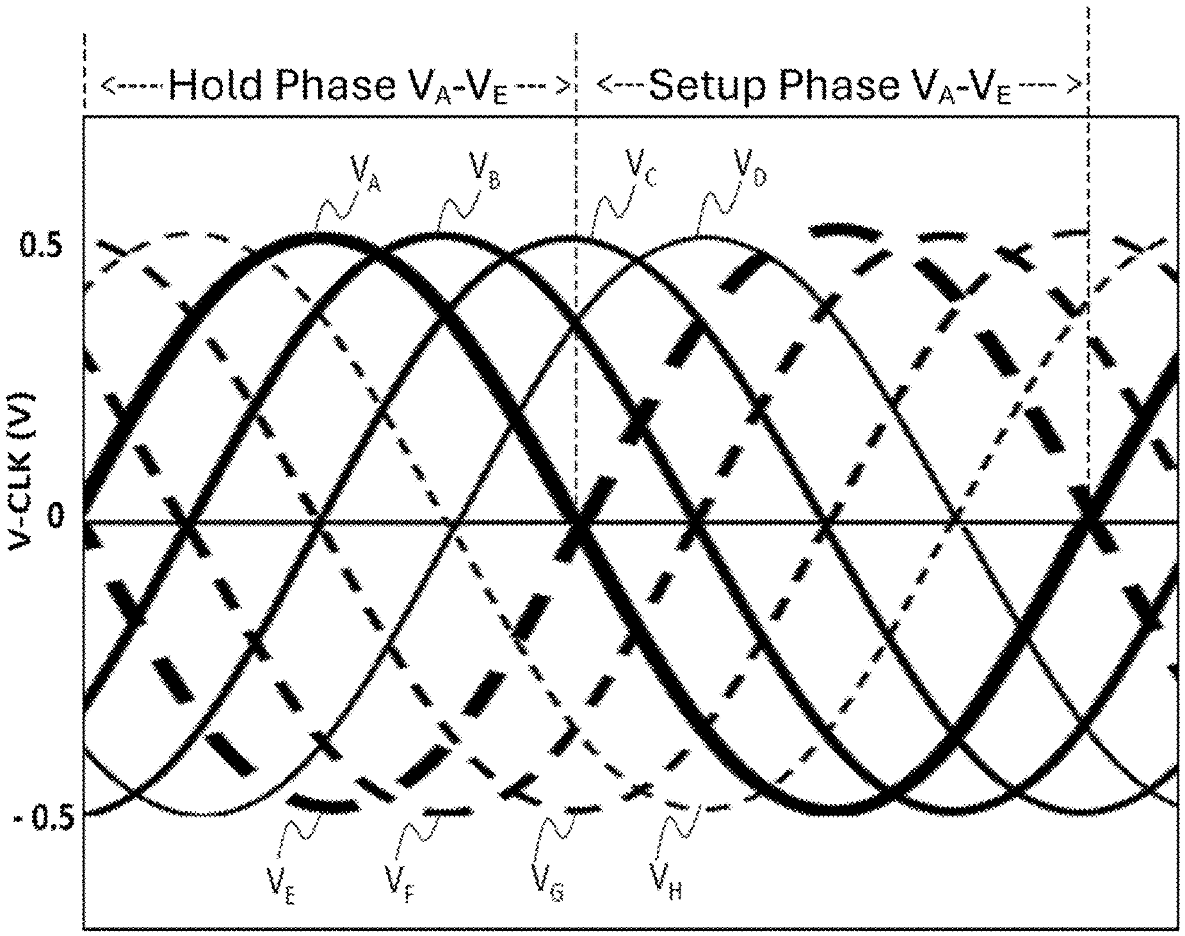
FIG. 2 is a graph depicting voltage/time relations for sinusoidal power signals $V_A$-$V_H$.

The term "phased sequence" refers to phasing of a sequence of sinusoidal power signals $V_A$-$V_H$ that provide operating power to chain 10 of quasi-adiabatic logic gates 12A-12H. Such phased sequencing of power to chain 10 of quasi-adiabatic logic gates 12A-12H results in outputs (e.g., both the carry output and the sum output) reflecting that phasing as indicated in FIG. 1. Each of the eight quasi-adiabatic logic gates 12A-12H of chain 10, as depicted in the FIG. 1 embodiment, is powered by a corresponding sinusoidal power signal $V_A$-$V_H$—a power signal with the functional voltage/time relation of $V_X = V \cdot \sin(\omega t - \theta_X)$—of a common amplitude V, of a common frequency $\omega = 2\pi f$, but of a different phase $\theta_X$ from the sinusoidal power signals $V_Y \neq V_X$ providing power to each of the others of chain 10 of quasi-adiabatic logic gates 12A-12H. Here, each of the subscripts $_X$ and $_Y$ is a variable that takes on one of the values $_{A\text{-}H}$ of the appropriate member of chain 10 of quasi-adiabatic logic gates 12A-12H. FIG. 2 is a graph depicting these voltage/time relations for sinusoidal power signals $V_A$-$V_H$. Note that the sinusoidal power signals $V_A$-$V_H$ have symmetry typical of sinusoids (e.g., $V_A(t) = -V_A\ (t + \pi/\omega)$) As depicted in FIG. 1, quasi-adiabatic logic gate 12A is provided operating power via sinusoidal power signals $V_A$ and $V_E$, with phases $\theta_A = 0°$ and $\theta_E = 180°$, applied across first and second power nodes 18A and 20A (e.g., first power node 18A is often labeled $V_{DD}$ and second power node 20A is often labeled $V_{SS}$). Quasi-adiabatic logic gate 12B is provided operating power via sinusoidal power signals $V_B$ and $V_F$, with phases $\theta_B = 45°$ and $\theta_F = 225°$, applied across first and second power nodes 18B and 20B. Each of subsequent quasi-adiabatic logic gates 12C-12H of chain 10 is provided operating power via a sinusoidal power signals $V_C$, $V_D$, $V_E$, $V_F$, $V_G$, $V_H$ and their complementary signals $V_G$, $V_H$, $V_A$, $V_B$, $V_C$, $V_D$, respectively, with phase angles of 45° greater than the sinusoidal power signals powering its immediately preceding quasi-adiabatic logic gate 12B-12G, respectively. In this way, the phase angles of the phased sequence of sinusoidal power signals $V_A$-$V_H$ are ordered as follows: $\theta_A < \theta_B < \theta_C < \theta_D < \theta_E < \theta_F < \theta_G < \theta_H$. Should a subsequent quasi-adiabatic logic gate 12I be added to chain 10 immediately following quasi-adiabatic logic gate 10H, quasi-adiabatic logic gate 12I would be provided power via sinusoidal power signals $V_A$, with phase $\theta_A = 0°$, applied across first and second power nodes 181 and 20I, as such a phase angle $\theta_A$ and $V_E$ would lag the phase angle $\theta_H$ and $V_D$, respectively, by 45°—the delta phase angle $\Delta\theta$ between adjacent ones of the phased sequence of sinusoidal power signals. Thus, the phased sequence is modulo phased sequence of sinusoidal power signals (e.g., a 0° phase shifted signal can be equivalent to a 360° phase shifted signal, a 45° phase shifted signal can be equivalent to a 405° phase shifted signal).

In some embodiments, instead of powering quasi-adiabatic logic gates using complementary sinusoidal power signals, as described above, a single sinusoidal power signal along with a ground (e.g., reference potential level) bias can be used. In such embodiments, either first or second power nodes 18A-18H or 20A-20H are connected to ground, while the other of first or second power nodes 18A-18H or 20A-20H are connected to sinusoidal power signals $V_A$-$V_H$. In the depicted embodiment, however, first and second power nodes 18A-18H or 20A-20H are connected to complementary ones of sinusoidal power signals $V_A$-$V_H$. For example, first power node 18A receives sinusoidal power signal $V_A$ and second power node 20A receives sinusoidal power signal $V_E$, which is 180° out of phase with sinusoidal power signal $V_A$. Such complementary signals can be present when the plurality of sinusoidal power signals $V_A$-$V_H$. consists of an even number N of sinusoidal power signals, thereby defining the delta phase angle $\Delta\theta$ of 360°/N. For such even numbered phase sequences, the phase $\theta(M)$ of the $M^{th}$ member of the sequence is complement to the phase $\theta(M+N/2 \bmod N)$ the $(M+N/2)^{th}$ member of the sequence.

During each period of sinusoidal power signals $V_A$-$V_H$, each of quasi-adiabatic logic gates 12A-12H has two phases of operation: a resolving phase and a non-resolving phase. During the resolving phase (e.g., a hold phase, an output generation phase), quasi-adiabatic logic gates 12A-12H generate an output signal on logic output terminals in response to input signals received on logic input terminals. During the resolving phase, the output signals generated at the logic output terminals closely track the voltage levels of either the voltages applied to first power terminals 18A-18H or the voltages applied to second power terminals 20A-20H. In some embodiments, each of the resolving and non-resolving phases are about half of a period of sinusoidal power signals $V_A$-$V_H$. Thus, during the resolving phase, the output voltages at logic output terminals can be sinusoidal in nature, tracking the sinusoidal power signal $V_A$-$V_H$. These output signals generated at the logic output terminals correspond to the logic functions performed by the pullup and pulldown networks comprising quasi-adiabatic logic gates 12A-12H. During the resolving phase (e.g., a setup phase, a switching phase, a phase when the input is received (e.g., the input can change state)) the output signals generated closely tracks either: a) the voltages applied to the first power nodes 18A-18H; or b) the voltages applied to the second power nodes 20A-20H. This resolving phase occurs during times in which a polarity of the sinusoidal power signal $V_A$-$V_H$ is of a first polarity. For example, in some embodiments, quasi-adiabatic logic gate 12A is in the resolving phase in response to the sinusoidal power signals $V_A$-$V_H$ applied across first and second power nodes 18A and 20A being of a positive polarity (i.e., the voltage at first power node 18A being more positive than the voltage at second power node 20A).

During the non-resolving phase, quasi-adiabatic logic gates 12A-12H do not generate an output signal on logic output terminals. During the non-resolving phase, the pullup and pulldown networks of quasi-adiabatic logic gates 12A-12H are biased such that neither of which conductively couples the logic output terminals with first or second power node. This non-resolving phase occurs during times in which a polarity of the sinusoidal power signal $V_A$-$V_H$ is of a second polarity opposite to the first polarity. For example, in some embodiments, quasi-adiabatic logic gate 12A is in the non-resolving phase in response to the sinusoidal power signals $V_A$-$V_H$ applied across first and second power nodes 18A and 20A being of a negative polarity (i.e., the voltage at first power node 18A being more negative than the voltage at second power node 20A). FIG. 2 shows that for the first half of the period shown, a logic gate powered by $V_A$-$V_E$ (e.g., logic gate 12H) can be in the resolving phase (e.g., the hold phase), such as because the voltage of $V_A$ is greater than the voltage of $V_E$. This can provide a source voltage across the logic gate. FIG. 2 shows that for the second half of the period shown, a logic gate powered by $V_A$-$V_E$ (e.g., logic gate 12H) can be in the non-resolving phase (e.g., the setup phase), such as because the voltage of $V_A$ is less than the voltage of $V_E$. This can result in the source voltage across the logic gate being negative, such as may disable and/or depower the logic gate.

FIG. 2 shows sinusoidal clock signals as an illustration, but any form of clock signal can be used (e.g., hexagonal wave, triangle wave, square wave, etc.). In an example, two or more (e.g., all) of the clock signals (e.g., $V_A$-$V_E$) can have the same waveform, but may be phase shifted in time. In an example, one or more of the clock signals can have a waveform that differs from one or more of the other clock signals. In an example, the one or more clock signals can be equally phase-distributed across 360 degrees of phase. In an example, the one or more clock signals can be phase-distributed across 360 degrees in any fashion (e.g., without requiring equal distribution). In an example, the duty cycle (e.g., the ratio of time the waveform spends above zero volts to the time the waveform spends below zero volts, the ratio of the time in a high state to the time in a low state) of one or more of the clock signals can be substantially 50 percent. In an example, the duty cycle of one or more of the clock signals need not be substantially 50 percent.

Although FIG. 2 illustrates eight sinusoidal power signals phase-distributed over 360°, other examples can use a different number of power signals (e.g., more or less than 8). In some embodiments, four sinusoidal power signals can be phase-distributed over 360°, such as at 90° intervals. Using four power signals can reduce the complexity of the power supply circuit and clock distribution network, such as while still providing quasi-adiabatic operation. In some embodiments, a circuit may include a mixture of four-phase and eight-phase regions, where different portions of the circuit operate with different numbers of clock phases, such as based on timing requirements. For example, a high-accuracy path may use eight phases to provide finer timing resolution, while relatively lower-accuracy portions may use four phases, such as to reduce overhead.

Figure 3:
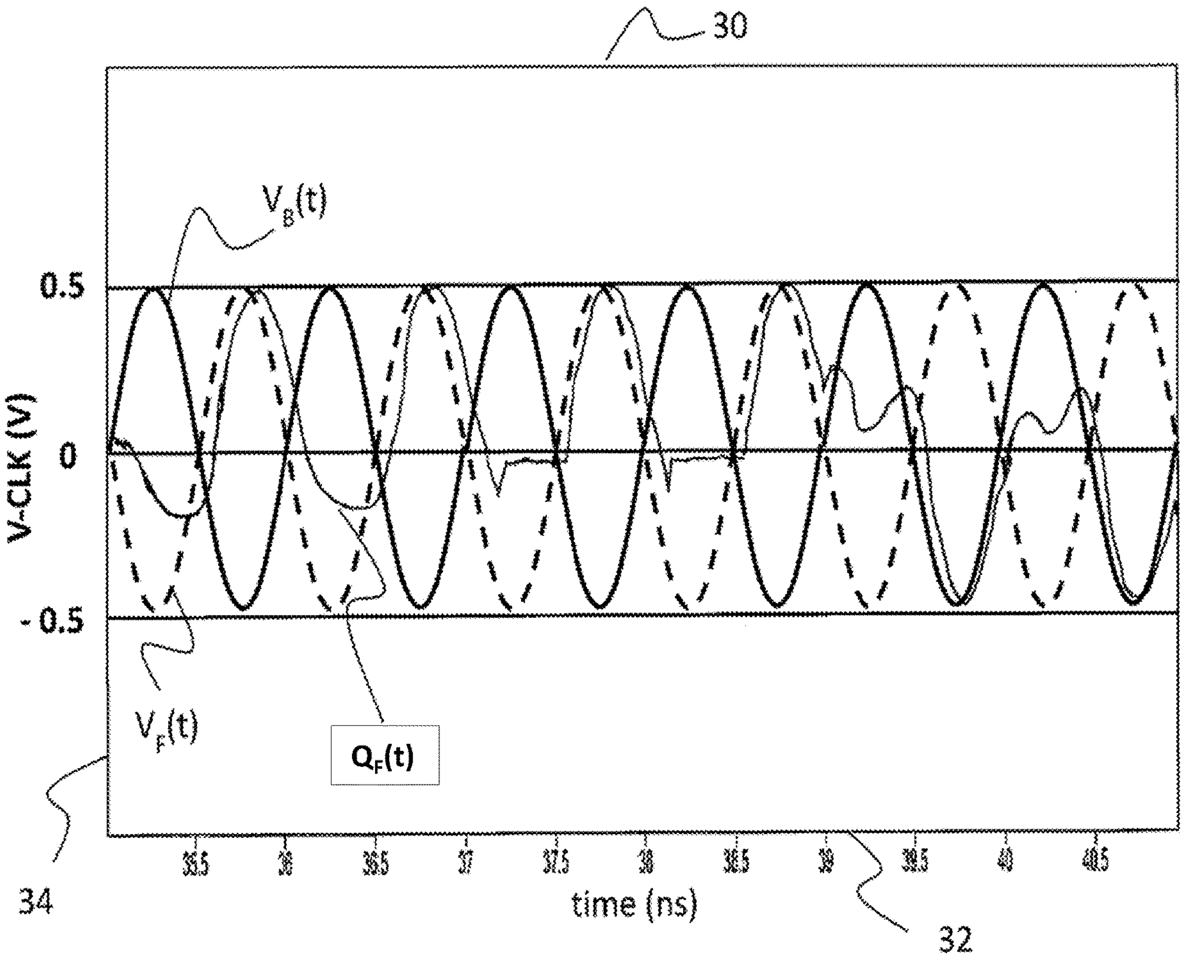
FIG. 3 is a graph of an example output signal generated by a quasi-adiabatic logic gate operationally powered by a sinusoidal power signal.

FIG. 3 is a graph of an example output signal generated by a quasi-adiabatic logic gate operationally powered by a sinusoidal power signal. In FIG. 3, graph 30 includes horizontal axis 32, vertical axis 34 and voltage/time relations $V_B(t)$, $V_F(t)$ and $Q_F(t)$. Horizontal axis 32 is indicative of time, and vertical axis 34 is indicative of voltage. Voltage/time relations $V_B(t)$ and $V_{F(t)}$ are the voltage/time relations of sinusoidal power signals $V_B$ and $V_F$, respectively. Sinusoidal power signals $V_B$ and $V_F$ are complementary power signals that can be coupled to first and second power nodes 18B and 18F of quasi-adiabatic logic gate 12B of chain 10. Voltage/time relation $Q_F(t)$ is indicative of the voltage at an output of quasi-adiabatic logic gate 12B. As depicted in graph 30, voltage/time relation $Q_F(t)$ has resolving phases and non-resolving phases. The resolving phases correspond to times at which voltage/time relation $V_B(t)$ indicates voltages greater than those of voltage/time relation $V_F(t)$. Conversely, the non-resolving phases correspond to times at which voltage/time relation $V_B(t)$ indicates voltages less than those of voltage/time relations $V_E(t)$. During the resolving phases, voltage/time relation $Q_F(t)$ tracks closely with either voltage/time relations $V_B(t)$ or voltage/time relations $V_F(t)$, depending on the logic function performed by quasi-adiabatic logic gate 12B and the input signals present at logic input terminal(s)s of quasi-adiabatic logic gate 12B. Note that during the first four (in time) resolving phases, voltage/time relations $Q_F(t)$ tracks voltage/time relation $V_B(t)$, indicated a high logic output signal. During the last two (in time) resolving phases, voltage/time relations $Q_F(t)$ tracks voltage/time relation $V_F(t)$, indicated a low logic output signal.

Adiabatic logic, as disclosed herein, results in low power consumption, as compared with traditional CMOS logic. There are two principal reasons that power is reduced using methods and systems disclosed herein. First, the pullup and/or pulldown networks begin to charge the output node when the voltage difference thereacross is at or near zero volts. Such zero-voltage switch closing is a low power (and low energy) approach to charging a node such as an output node and can significantly reduce the heat generated by the switching at that transistor. Second, using sinusoidal power signals enables recovering or recycling energy in the form of electric charge, as will be described in more detail below.

The energy stored in the capacitances of the logic output terminals of quasi-adiabatic logic gates 12A-12H can be recaptured by a tank circuit. This recaptured energy can then be reused on the next cycle instead of being dumped into a ground pin. In this example, the quasi-adiabatic logic gates need not include a ground pin. In an example, a chip (e.g., a complete chip) or a portion of a chip can be operated without a ground pin (e.g., without a ground connection), such as by using a plurality of phase-distributed clock signals. A tank circuit is obtained by using the internal capacitance of the circuitry along with an on-chip and/or off-chip inductance, so as to resonate at the operating frequency (i.e., the frequency f of the sinusoidal power signals $V_A$-$V_H$) to reuse the energy to recharge the internal nodes. The off-chip power supply provides the frequency and waveform for the circuits. The power required from the power supply is minimized by this reuse. A variable inductance can be used so that the tank circuit can be optimized externally for resonant frequency depending upon the particular characteristics of the integrated circuit (e.g., operating conditions, corner of manufacture, etc.).

Using such sinusoidal power signals $V_A$-$V_H$ to provide operating power to quasi-adiabatic logic gates 12A-12H provides several advantages over some approaches of supplying operating power (e.g., using DC power rails). For example, such sinusoidal power signals $V_A$-$V_H$ cause the output signals generated at the logic output terminals to follow one of first and second power nodes 18 or 20 in a sinusoidal fashion. Such sinusoidal output signals do not result in large current spikes during logic transitions as are seen in conventional CMOS logic.

Phasing of the sequence of sinusoidal power signals $V_A$-$V_H$ that provide operating power to chain 10 of quasi-adiabatic logic gates 12A-12H also provides various advantages over conventional approaches of supplying operating power. Such phasing (e.g., each quasi-adiabatic logic gate 12(X+1) receives operating power with a phase delay of 45° from the phase of the operating power provided to the quasi-adiabatic logic gate 12X whose logic output terminals are connected to its logic input terminals (X+1)) can be coordinated with the gate delay of the quasi-adiabatic logic gates 12A-12H. Such coordination of phasing can ensure that the gate delays of quasi-adiabatic logic gates 12X are such that the output signals are present at the logic output terminals before the resolving phase begins for the next quasi-adiabatic logic gate 12(X+1) at which these output signals are present on the logic input terminals. There is then an overlap of resolving phases (e.g., 135° of overlap for 45° phasing), during which times, logic gates that are adjacent to one another in the phased sequence are both in the resolving phase of operation. Such overlapping resolving phases ensures that the logic operations performed by the quasi-adiabatic logic gates use the appropriate inputs provided thereto.

Figure 4:
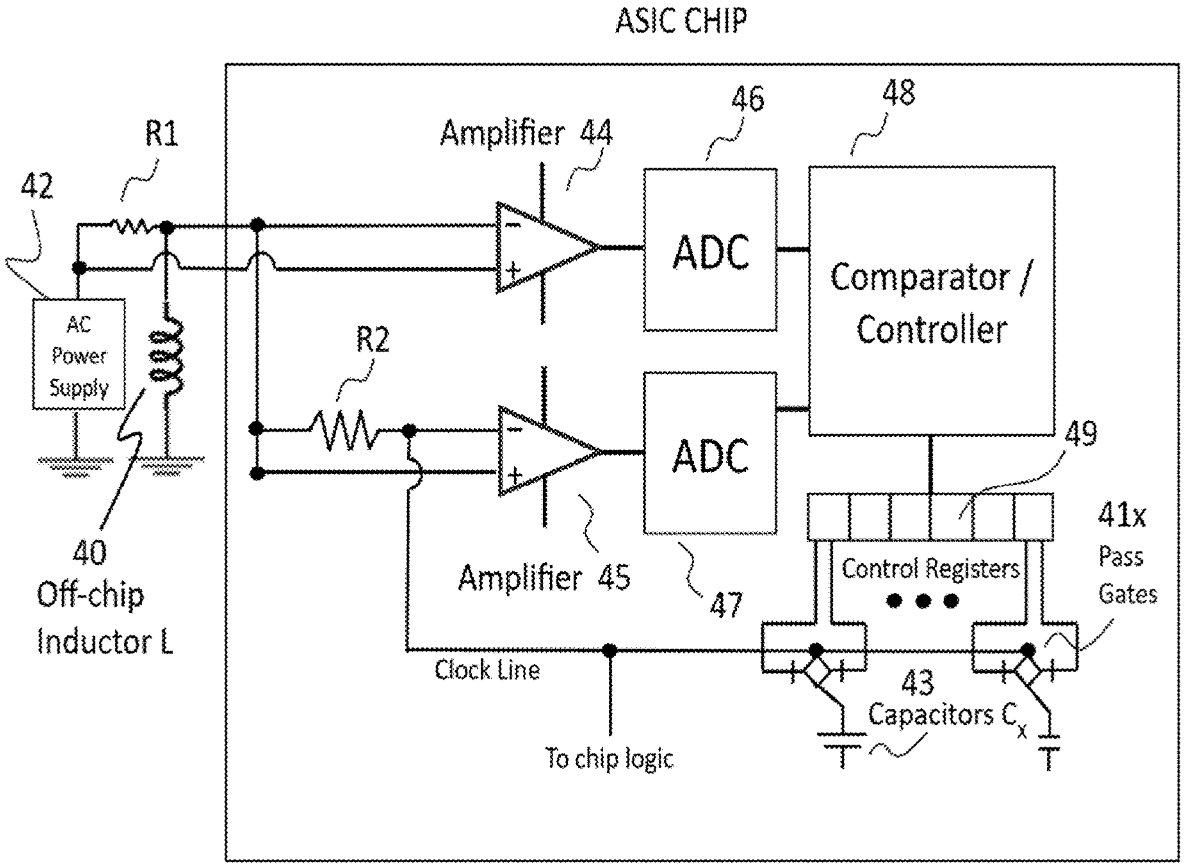
FIG. 4 is a schematic diagram of a method to automatically tune capacitance of a tank circuit of an AC power supply.

FIG. 4 is a schematic diagram of a method to automatically tune capacitance of a tank circuit of an AC power supply. Such capacitance tuning maintains a resonant frequency over a range of load capacitance values as well as over changes in the values of an inductor of the tank circuit and over operating frequencies of an AC power supply. Maintaining the resonant frequency minimizes power losses of the AC power supply.

The power supplying system depicted in FIG. 4 includes an AC power supply 42, resistor R1, inductor L, which provide operating power to an ASIC chip. The ASIC chip includes resonant frequency control components; amplifiers 44 and 45, sensor resistor R2, ADC's 46 and 47, comparator/controller 48, control registers 49, pass gates 41*a*-41*x*, and capacitors Ca-Cx. ASIC chip also includes chip logic for performing some logical operations, such as, for example, a processor.

AC power supply 42 is configured to generate a sinusoidal power signal of a given frequency $f_{POWER}$, such as one of sinusoidal power signals $V_A$-$V_H$. Inductor L is selected such that the resonant frequency of the tank circuit created by inductor L and the effective capacitance presented by ASIC chip at power node coupled to inductor L is approximately equal to the frequency $f_{POWER}$ of the sinusoidal power signal generated by AC power supply 42. The ASIC has chip logic that includes quasi-adiabatic logic gates that perform the logic operations of the ASIC, as well as the resonant frequency control components. The resonant frequency $f_{RESONANCE}$ of this system is given by:

$$f_{RESONANCE} = \frac{1}{2\pi\sqrt{LC}}. \tag{1}$$

By providing selectable capacitors Ca-Cx, the resonant frequency $f_{RESONANCE}$ can be maintained over a variety of conditions, such as over process variations, temperature variations, voltage variations, and operational variations. The capacitance of the ASIC can vary over the operation depending upon the data as well. When the resonant frequency $f_{RESONANCE}$ of the system is tuned to the frequency $f_{POWER}$ of the sinusoidal power signal generated by AC power supply 42, the operating power drawn by the AC power supply will be at a minimum.

AC power supply 42 provides the sinusoidal power signal that charges up the system initially and then maintains sufficient power to operate the system. The combination of the off-chip inductor L, which, in some embodiments, can be located on chip, along with the chip logic capacitance and capacitors Ca-Cx, whichever ones are selected, provide resonant frequency $f_{RESONANCE}$ at the frequency $f_{POWER}$ of the sinusoidal power signal generated by AC power supply 42. The capacitance of the chip logic is determined by the circuitry required by the ASIC to perform its logic functions. Capacitance 43 is determined by the selection of capacitors Ca-Cx, which are selected so as to keep the system in resonant frequency. For example, if the chip logic capacitance increases by 5%, then the capacitance 43 can be reduced by 5% to maintain resonance. If the inductor L varies by 5% across a lot such that some systems have higher inductance, and others lower inductance, the capacitance 43 can be controlled so as to maintain resonance.

Capacitance 43 consists of a selected set of a plurality of capacitors, which can be of increasing size, (e.g., binary weighted). For example if C1 equals 10 pF, then C2 would equal 20 pF, C3=40 pF, C4=80 pF, C5=160 pF, C6=320 pF, C7=640 pF, C8=1.28 nF, C9=2.56 nF, C10=5.12 nF, C11=10.24 nF, C12=20.48 nF, C13=40.96 nF, C14=81.92*10-9, C15=163.84 nF, C16=328 nF, allowing for a fine adjustment of the capacitance value with only a 16 bit register. Each bit of control register 49 can control capacitance 43 by controlling operation (i.e., opening and/or closing) of a pass gate connected to a corresponding one of capacitors Ca-Cx. By closing the pass gates, corresponding capacitors Ca-Cx are connected to the load presented by the chip logic, thereby adding capacitance to capacitance 43. This control of capacitance 43 adjusts the value of the L*C in the resonant frequency equation.

The voltages from both sides of resistor R1 determine the voltage difference across R1. Since the resistance value in Ohms of R1 is known, using V=IR, the current I can also be known. Knowing both current I and voltage V, the power can be determined using P=VI. Both sides of R1 are fed into amplifier 44 so as to obtain the power coming from the AC power supply. Similarly, with R2, the power is obtained going to the adjusting capacitors Ca-Cx and to the chip logic that performs the logic function of the ASIC. ADC's 46 and 47 change the values from the amplifiers to digital numbers and those numbers are entered to comparator/controller 48. Comparator/Controller 48 compares the current values of power from AC power Supply 42 and the power to the chip with previous sample values. The value in control registers 49 can then be adjusted. If the ratio between the two values shows better resonance than previous values, the number in control register 49 is adjusted (increased by 1 or decreased by 1) to continue to reduce the power from AC power supply 42 as compared with the power to the ASIC. The registers will continuously adjust the value of capacitors Ca-Cx so as to obtain the lowest power from AC power supply 42 and realize minimum power of operation.

Note that ASICs often have many millions of logic gates. The switching of internal nodes from low to high or high to low is dependent upon the actual values of data being processed thereby. However, with the data being somewhat random, the number of logic gates switching low or switching high at any given time will be close to 50% each way. The more logic gates there are on the chip, the percentage of the number switching in any given direction will be closer to 50%. The likelihood of a significant number switching nodes all in one direction is very small, and not likely to be recurrent for any meaningful length of time. Thus, while an extreme case could be developed, it is not an issue for most applications.

In some embodiments, the power supply circuit is configured as a bidirectional power supply. The bidirectional power supply configuration can enable energy recovery from the quasi-adiabatic logic circuits back to the power supply during portions of the sinusoidal cycle when the output nodes are discharging. This bidirectional energy flow can help to reduce net power consumption compared to a unidirectional power supply that may dissipate energy during discharge phases.

In some embodiments, the power supply circuit can be implemented on-chip and can receive a DC input voltage of approximately 1V. The on-chip power supply can convert the DC input to the sinusoidal power signals $V_A$ through $V_H$. Implementing the power supply on-chip can reduce parasitic inductance and capacitance associated with off-chip connections, enabling higher operating frequencies. The on-chip power supply may be configured to modulate the frequency and/or amplitude of the sinusoidal power signals to optimize performance based on operating conditions, workload, or thermal constraints. For example, the frequency may be increased to improve throughput when thermal headroom is available, or the amplitude may be reduced to decrease power consumption during low-demand periods.

Figure 5:
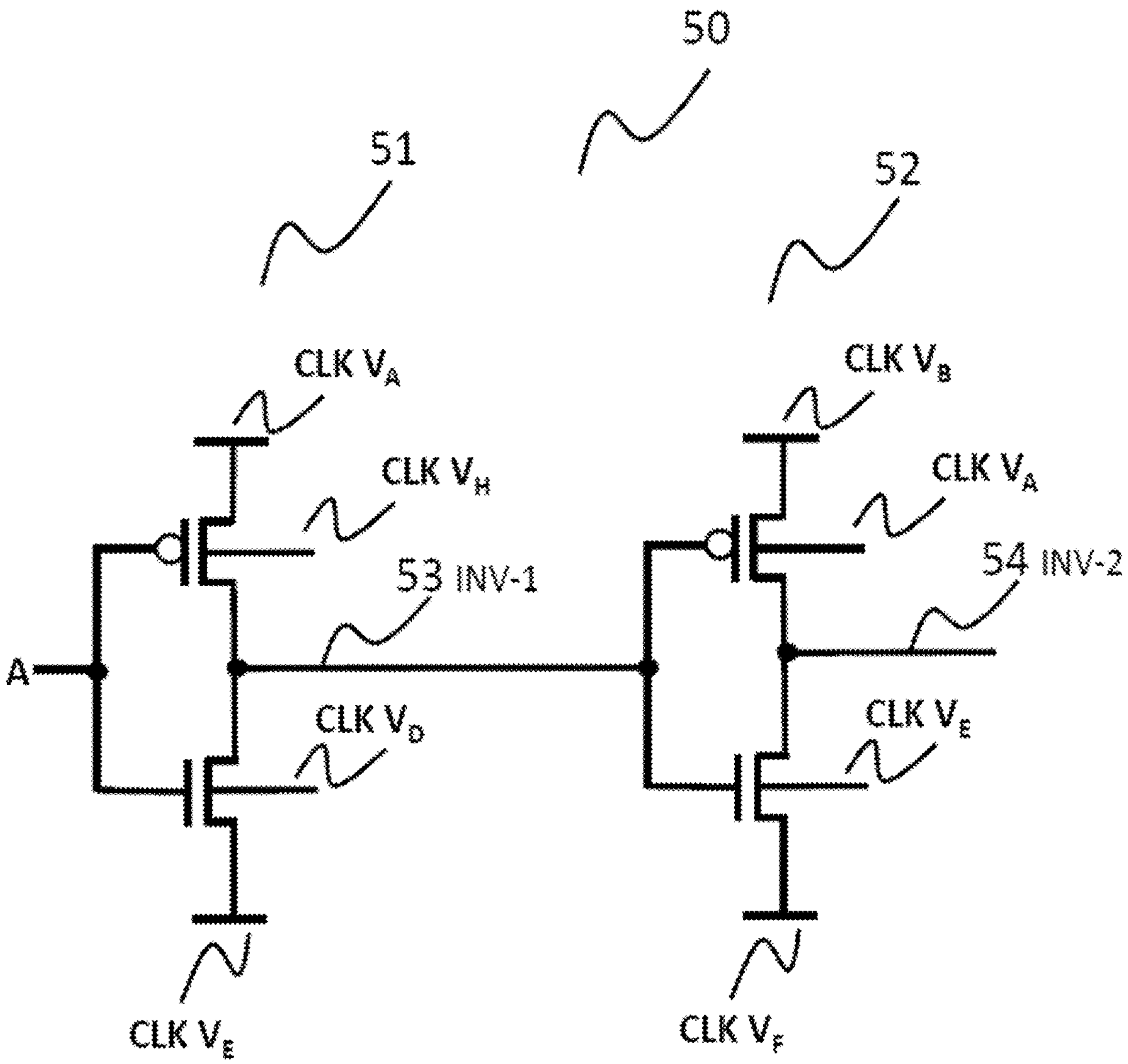
FIG. 5 is a schematic diagram of two sequential quasi-adiabatic inverters.

FIG. 5 is a schematic diagram of two quasi-adiabatic inverters configured in quasi-adiabatic fashion. In FIG. 5, inverters 51 and 52 are daisy-chain connected (i.e., output 53 of quasi-adiabatic inverter 51 is conductively coupled to the input of quasi-adiabatic inverter 52) to form non-inverting buffer 50. Not only are quasi-adiabatic inverters 51 and 52 connected in a phased sequence from a power perspective, but quasi-adiabatic inverters 51 and 52 have bodies that are biased in a phased sequence as well. Quasi-adiabatic inverter 51 is powered by sinusoidal power signals $V_A$ and $V_E$, thereby creating a sinusoidal power signal, from the $V_{DD}$ to the $V_{SS}$ nodes with a phase of 0° (as sinusoidal power signal $V_E$ is 180° degrees out of phase with sinusoidal power signal $V_A$). The PMOS device of the pullup network of quasi-adiabatic inverter 51 is biased by sinusoidal power signal $V_H$, which leads sinusoidal power signal $V_A$ that is connected to the $V_{DD}$ node of quasi-adiabatic inverter 51. The NMOS device of the pulldown network of quasi-adiabatic inverter 51 is biased by sinusoidal power signal $V_D$, which leads sinusoidal power signal $V_E$ that is connected to the $V_{SS}$ node of quasi-adiabatic inverter 51. Similarly, quasi-adiabatic inverter 52 is powered by sinusoidal power signals $V_B$ and $V_F$, thereby creating a sinusoidal power signal, from the $V_{DD}$ to the $V_{SS}$ nodes with a phase that lags, by 45°, the phase of the sinusoidal power signal powering quasi-adiabatic inverter 51. (as sinusoidal power signal $V_F$ is 180° out of phase with sinusoidal power signal $V_B$). The PMOS device of the pullup network of quasi-adiabatic inverter 52 is biased by sinusoidal power signal $V_A$, which leads sinusoidal power signal $V_B$ that is connected to the $V_{DD}$ node of inverter 52. The NMOS device of the pulldown network of inverter 52 is biased by sinusoidal power signal $V_E$, which leads sinusoidal power signal $V_F$ that is connected to the $V_{SS}$ node of inverter 52.

Such configuration ensures that during the non-resolving phase, sinusoidal power signal $V_A$ is low such that any input signal coupled to the input of quasi-adiabatic inverter 51 will not turn on the PMOS pullup transistor of quasi-adiabatic inverter 51. Additionally, sinusoidal power signal $V_E$ is high such that any signal from the input of quasi-adiabatic inverter 51 will not turn on the NMOS pulldown transistor of quasi-adiabatic inverter 51. Since neither the PMOS pullup transistor nor the NMOS pulldown transistor is on during this non-resolving phase, the output of quasi-adiabatic inverter 51 does not change during this phase (i.e., the non-resolving phase).

During the resolving phase, however, sinusoidal power signal $V_A$ is high and sinusoidal power signal $V_E$ is low, thereby allowing the input signal to determine which of the PMOS pullup transistor or NMOS pulldown transistor of quasi-adiabatic inverter 51 is on and which is off. This allows output 53 of quasi-adiabatic inverter 51 to follow the voltage of either sinusoidal power signal $V_A$ or sinusoidal power signal $V_E$, depending upon the value of the input signal to quasi-adiabatic inverter 51. The voltage at output 53 of quasi-adiabatic inverter 51 will follow sinusoidal power signal $V_A$ or sinusoidal power signal $V_E$ closely, reducing the power consumed. Quasi-adiabatic inverter 52 operates in a similar fashion.

Figure 6:
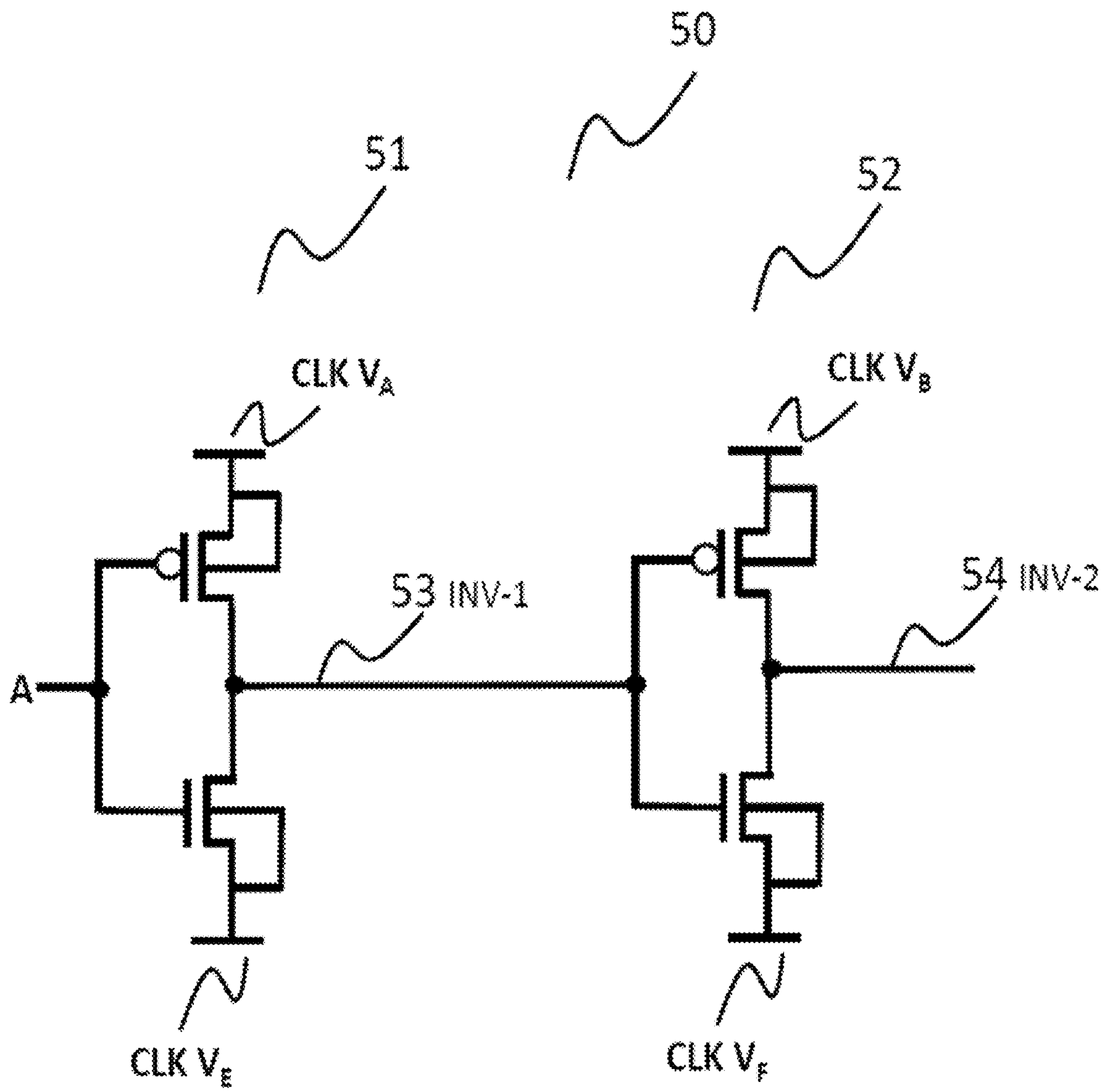
FIG. 6 is a schematic diagram of two sequential quasi-adiabatic inverters, with bodies biased to respective sources.

The body biasing for each of quasi-adiabatic inverters 51 and 52 is that of sinusoidal power signal for the previous gate (i.e., the gate providing the input signal to quasi-adiabatic inverters 51 and 52). Such a biasing configuration ensures that, during the resolving phase, the input signal (which follows one of the sinusoidal power signals of the previous gate) will be 180° out of phase with the body biasing of the device that will be turning on (e.g., either the NMOS transistor or the PMOS transistor). Such biasing also ensures that, during the resolving phase, the input signal will be in phase with the body biasing of the device that will not be turning on (e.g., the other of the NMOS transistor or the PMOS transistor than the one that will be turning on). This biasing provides for low gate capacitance for the device that does not turn on, as both gate and body are biased with the same phased sinusoidal power signal. For the device that is turning on, this biasing ensures that the minimum on resistance can be achieved. Other methods of biasing the bodies of the transistors can be performed. For example, FIG. 6 depicts the two daisy-chained inverters 51 and 52 depicted in FIG. 5, but with the body and source of each of the transistors conductively coupled to one another. Such body biasing can be performed, especially if the differential voltage (e.g., $V_E$-$V_A$) of the operating power provided across the quasi-adiabatic logic gates doesn't ever exceed the voltage required to turn on the two series-connected parasitic body-drain diodes of the pull-down and pull-up transistors. Such low-voltage operation thus permits simplification of the clock routing and perhaps reduced geometries of the circuitry layout. Furthermore, biasing the bodies of transistors by their respective sources results in threshold voltages that are independent of the voltages of the sinusoidal power signals to which these sources are connected (i.e., such biasing prevents variations in threshold voltages due to the body-biasing effect).

In some embodiments, a peak-to-peak amplitude of each of the phased sequence of sinusoidal power signals $V_A$-$V_H$ is less than a sum of threshold voltages of the pullup and pulldown transistors $V_{THN}$+$V_{THP}$ that perform the logic pullup and pulldown operations of quasi-adiabatic logic gates 12A-12H. In such embodiments, very low power operation can be realized as crowbar current becomes negligible.

The quasi-adiabatic logic gates described herein can facilitate generation of complementary signals. Because each gate can produce an output that transitions with the sinusoidal power signal, an inverted version of any signal can be generated by providing the signal to an inverter gate clocked by the same or an appropriate subsequent phase. This can enable efficient feeding of complement signals to downstream gates, such as without requiring additional inversion stages or delay matching circuits. In some embodiments, both true and complement versions of a signal can be generated in parallel and can be routed to subsequent logic stages as needed.

Figure 7A:
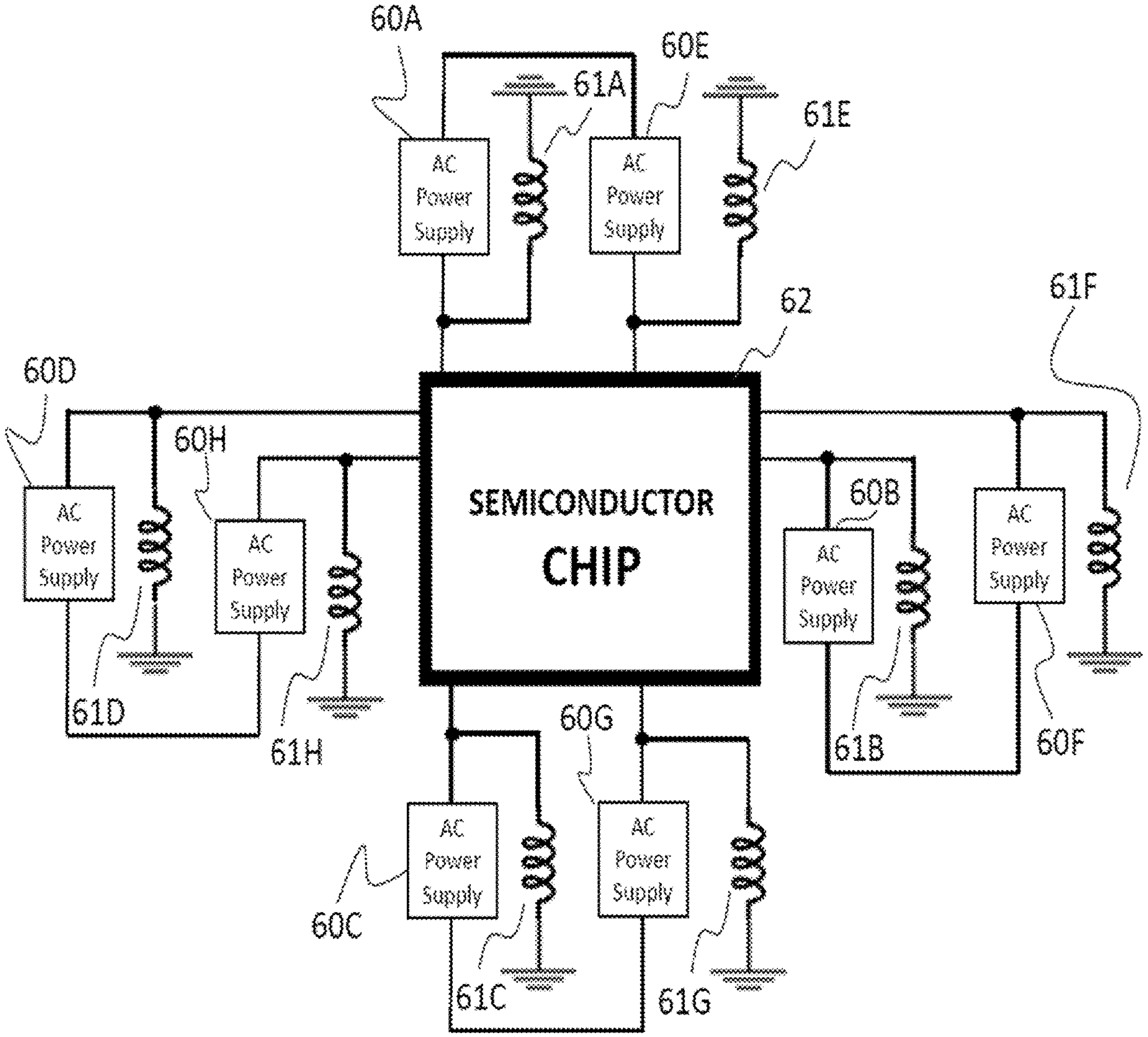
FIG. 7A is a schematic diagram of a semiconductor chip configured in quasi-adiabatic fashion with AC power supplies.

FIG. 7A is a schematic diagram of a semiconductor chip configured in quasi-adiabatic fashion with AC power supplies. In FIG. 7A, operating power is provided to semiconductor chip 62 by AC power supplies 60A-60H. AC power supplies 60A-60H are configured to generate sinusoidal power signals $V_A$-$V_H$, respectively, as described above and as depicted in FIG. 2. In some embodiments, sinusoidal power signals that are complementary (i.e., 180° out of phase with respect to one another), such as, for example, sinusoidal power signals $V_A$ and $V_E$, can be generated by a single AC power supply, which is configured to generate an AC power supply signal along with its complement, as is known in the art. Tank circuits that are created in this fashion, can be tuned to the common frequency of sinusoidal power signals $V_A$-$V_H$. Such tuning of these tank circuits can be performed in a variety of manners as are known in the art. For example, tuning can be accomplished by changing magnetic coupling of the windings of an inductor (e.g., by changing the position of a magnetic core).

Internal to the semiconductor chip 62, each pair of complementary power nodes can exchange energy with one another. For example, sinusoidal power signal $V_A$ stores some energy in the capacitive load of a quasi-adiabatic logic gate powered thereby during its resolving phase. Most of this stored energy will be subsequently transferred to and reclaimed by its complement—sinusoidal power signal $V_E$. Similarly, a quasi-adiabatic logic gate powered by sinusoidal power signal $V_E$ stores some energy during its resolving phase, only to have much of that energy subsequently transferred to and reclaimed by sinusoidal power signal $V_A$. In this manner, much of the energy provided to these power nodes is exchanged between each pair of complementarily clocked power nodes.

Figure 7B:
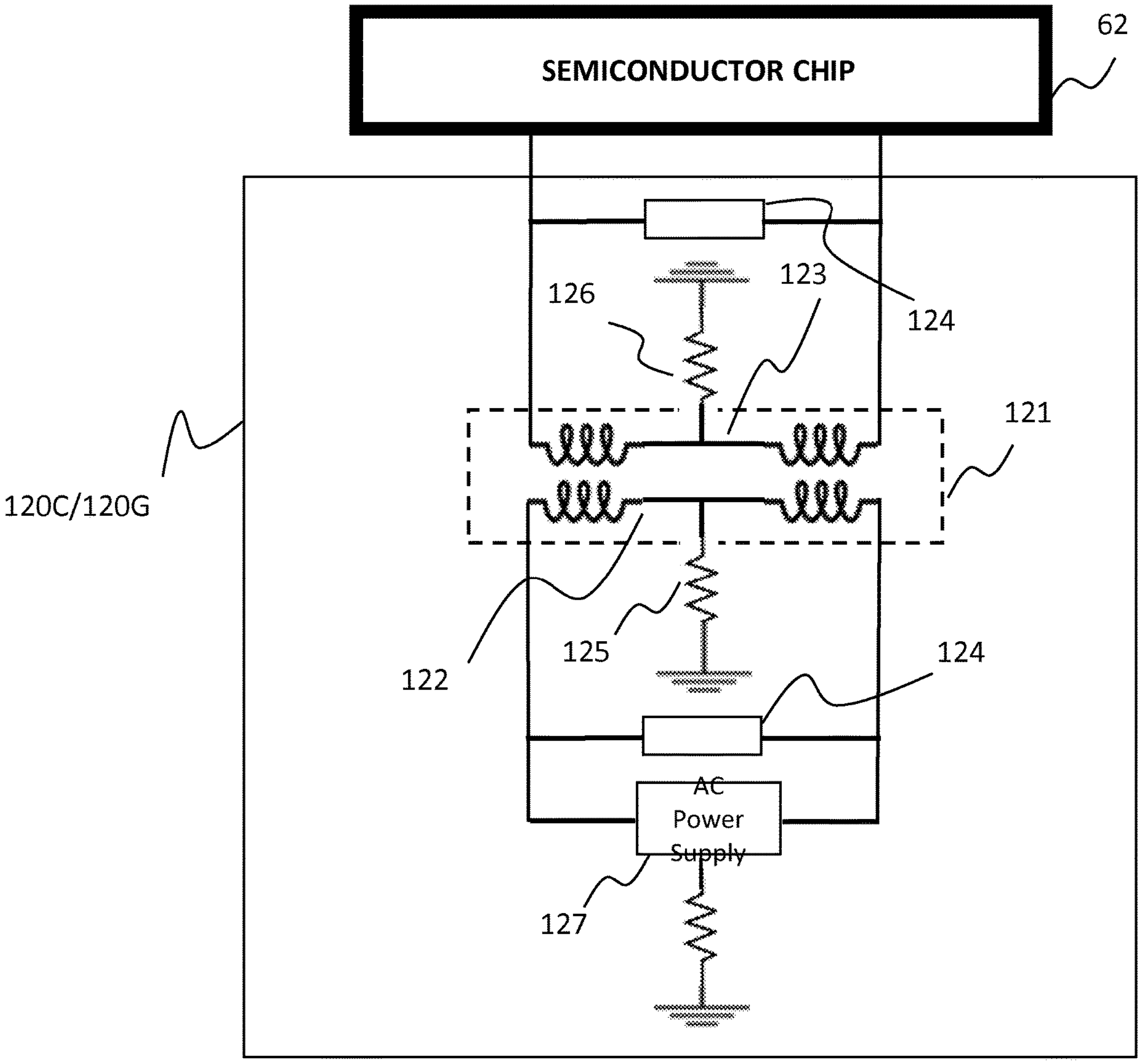
FIG. 7B is a schematic diagram of a semiconductor chip configured in quasi-adiabatic fashion with one AC power supply and transformer.

FIG. 7B is a schematic diagram of a semiconductor chip configured in quasi-adiabatic fashion with one AC power supply and transformer. In FIG. 7B, semiconductor chip 62 is conductively coupled with combined AC power supply 120C/120G. Combined AC power supply 120C/120G is configured to generate complementary sinusoidal power signals (e.g., sinusoidal power signals $V_C$ and $V_G$). Complementary sinusoidal power signals $V_C$ and $V_G$ are then provided to power terminals of semiconductor chip 62. Internal to semiconductor chip 62, power nodes conductively coupled to the power terminals distribute complementary sinusoidal power signals $V_C$ and $V_G$ to all C-phased and G-phased adiabatic logic gates, respectively, throughout semiconductor chip 62.

Combined AC power supply 120C/120G includes sinusoidal generator 127, transformer 121, balancing devices 124, as well as resistors 125 and 126. Sinusoidal generator 127 generates complementary sinusoidal power signals $V_C$ and $V_G$. Such sinusoidal power signals $V_C$ and $V_G$ have substantially equal amplitudes but opposite polarities. Sinusoidal generator 127 is conductively connected to primary windings 122 of transformer 121. Secondary windings 123 of transformer 121 are conductively connected to the power terminals of semiconductor chip 62. Transformer 121 has center taps for both primary windings 122 and secondary windings 123. Center taps of both primary windings 122 and secondary windings 123 are grounded via resistors 125 and 126, respectively.

If everything is perfectly balanced (i.e., sinusoidal generator 127 is symmetric, the primary windings have the same impedance, the secondary windings have the same impedance, the power terminals have the same impedance, etc.), then electrical current provided by one terminal of sinusoidal generator 127 will be equal to electrical current returning to the other terminal of sinusoidal generator 127. Similarly, electrical current going into one side of primary windings 122 of transformer 121 will be substantially equal to the electrical current coming out primary windings 122 of transformer 121.

If the load is not perfectly balanced, however, neither the voltages nor the currents generated by sinusoidal supply 127 will be precisely complementary. Any imbalances can be minimized by adding a balancing device 124 across primary windings 122 of transformer 121, adding a balancing device 124 across secondary windings 123, or both. One or more of the balancing devices 124 can be an inductor or capacitor or another reactive element. Additionally, one or more of the balancing devices 124—which can be located off-chip—may contain circuitry to provide a dynamic response to any changing imbalance of the circuitry, thereby maintaining system balance, should electrical components change over time or electrical parameters change over temperature, for example. Such circuitry can be configured to automatically correct for any imbalances that arise in these ways.

Some features of combined AC power supply 120C/120G follow. Electrical current provided by combined AC power supply 120C/120G flows to and from the primary windings of transformer 121 in a complementary manner. Electrical currents are induced in secondary windings 123 of transformer, due to electromagnetic coupling between primary windings 122 and secondary windings 123 of transformer 121. The power terminals of semiconductor chip 62 present a capacitive load to the secondary side of transformer 121. As described above, energy provided by sinusoidal generator 127 is exchanged between complementary sides of Combined AC power supply 120C/120G, as well as between complementary sides of primary windings 122 and secondary windings 123 of transformer 121. Thus, combined AC power supply 120C/120G can be thought of as an energy pump that maintains a power oscillation of the system.

Figure 7C:
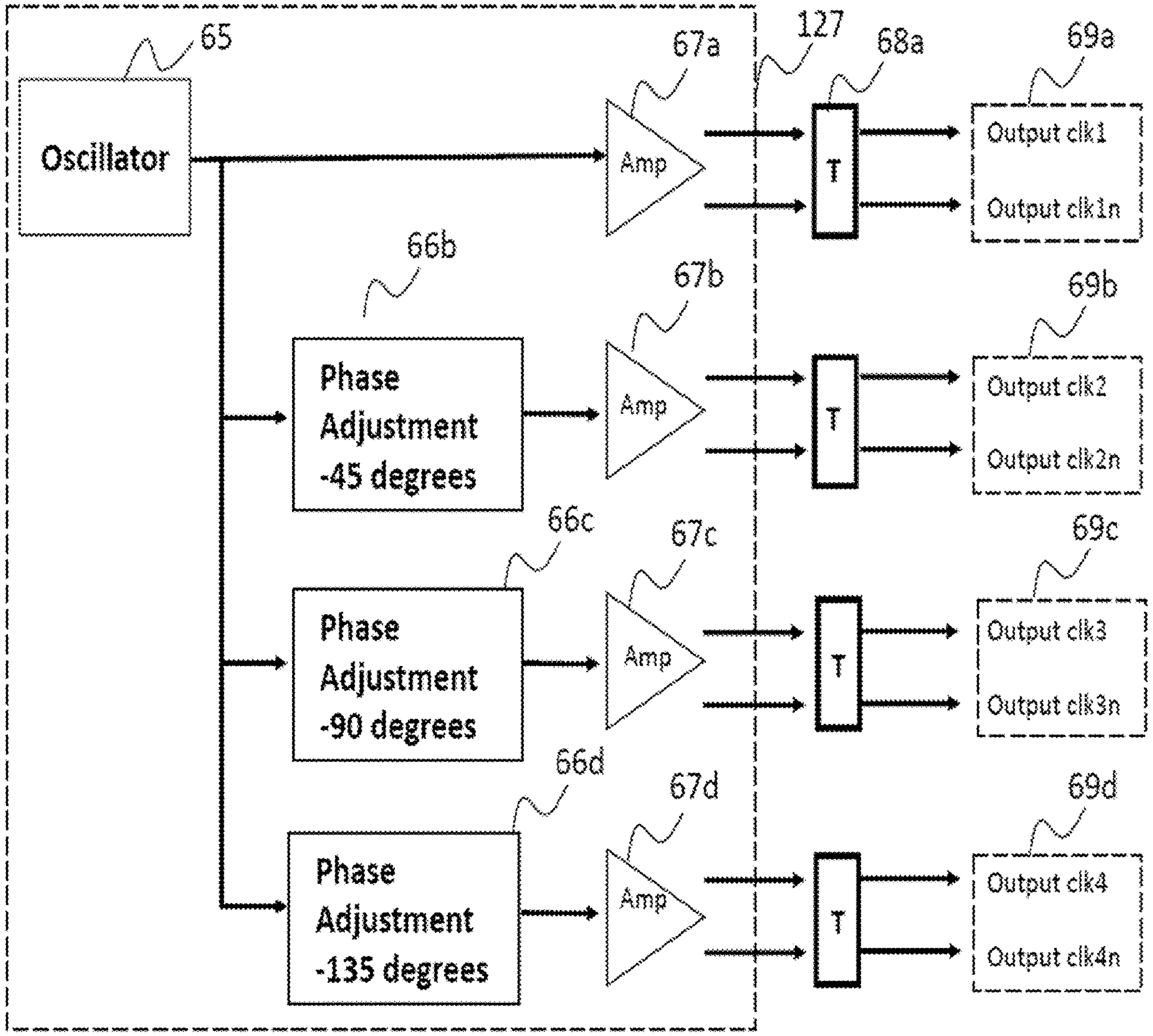
FIG. 7C is a schematic diagram of a sinusoidal power-generating circuit configured to generate a phased sequence of sinusoidal power signals.

FIG. 7C is a schematic diagram of a sinusoidal power-generating circuit configured to generate a phased sequence of sinusoidal power signals. In FIG. 7C, sinusoidal power-generating circuit 127 includes oscillator 65, phase shifters 66*b*-66*d*, and power amplifiers 67*a*-67*d*. Oscillator 65 is configured to generate a sinusoidal signal having a frequency configured to be about that of the resonant tank circuits depicted in FIG. 6. Phase shifters 66*b*-66*d* have inputs conductively connected to an output of oscillator 65. Phase shifters 66*b*-66*d* are configured to receive the sinusoidal signal generated by oscillator 65 and to generate a phase-shifted signal of the same frequency as the signal received thereby. Phase shifters 66*b*-66*d* are configured to shift the phase of the received signal by −45°, −90°, and −135°, respectively. Power amplifier 67*a* has an input conductively connected to output of oscillator 65, while power amplifiers 67*b*-67*d* have inputs conductively connected to outputs of phase shifters 66*b*-66*d*. Power amplifiers 67*a*-67*d* are configured to receive sinusoidal signals of a common frequency but with phases of 0°, −45°, −90°, and −135°, respectively. Power amplifiers 67*a*-67*d* are configured to generate an amplified version of the received signal along with its complement. Power amplifiers 67*a*-67*d* are also configured to provide energy to and receive energy from transformer 121, as such energy is being exchanged therebetween. In this way, eight phase-sequenced sinusoidal power signals are generated by sinusoidal power-generating circuit 127. The eight phase-sequenced sinusoidal power signals are then provided to power terminals of semiconductor chip 62 via transformers T, such as transformer 121 depicted in FIG. 7B. Because oscillator 65 is the source of all of the sinusoidal power signals, the frequencies of all the sinusoidal power signals will be the same with respect to one another. Moreover, such an architecture can result in fewer components than multi-oscillator counterparts. Various other methods for generating such a phased sequence of sinusoidal power signals can be used as are known in the art.

Figure 8:
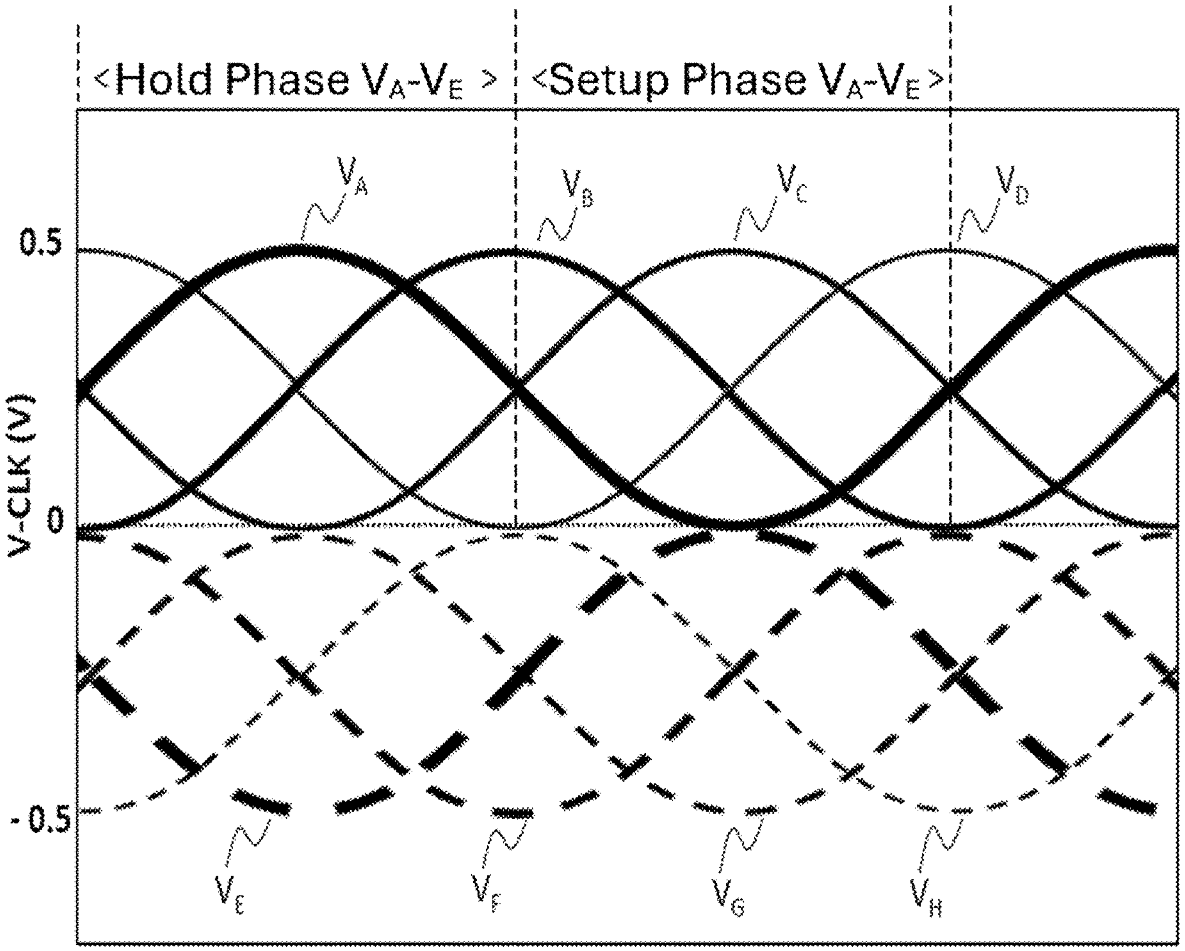
FIG. 8 is a graph depicting voltage/time relations for sinusoidal power signals $V_A$-$V_H$.

FIG. 8 is a graph depicting voltage/time relations for sinusoidal power signals $V_A$-$V_H$. Sinusoidal power signals $V_A$-$V_H$ differ from those depicted in FIG. 2. Thus, FIG. 8 represents another embodiment in which each of sinusoidal power signals $V_A$-$V_H$ is a sinusoidal signal with a DC bias. Generating sinusoidal power signals $V_A$-$V_H$ as depicted in FIG. 8 prevents the adiabatic-logic gates from inverted biasing (i.e., biasing the pull-down network to a voltage greater than the pull-up network). This, in turn, prevents any parasitic body-drain junctions from being forward-biased.

Figure 9:
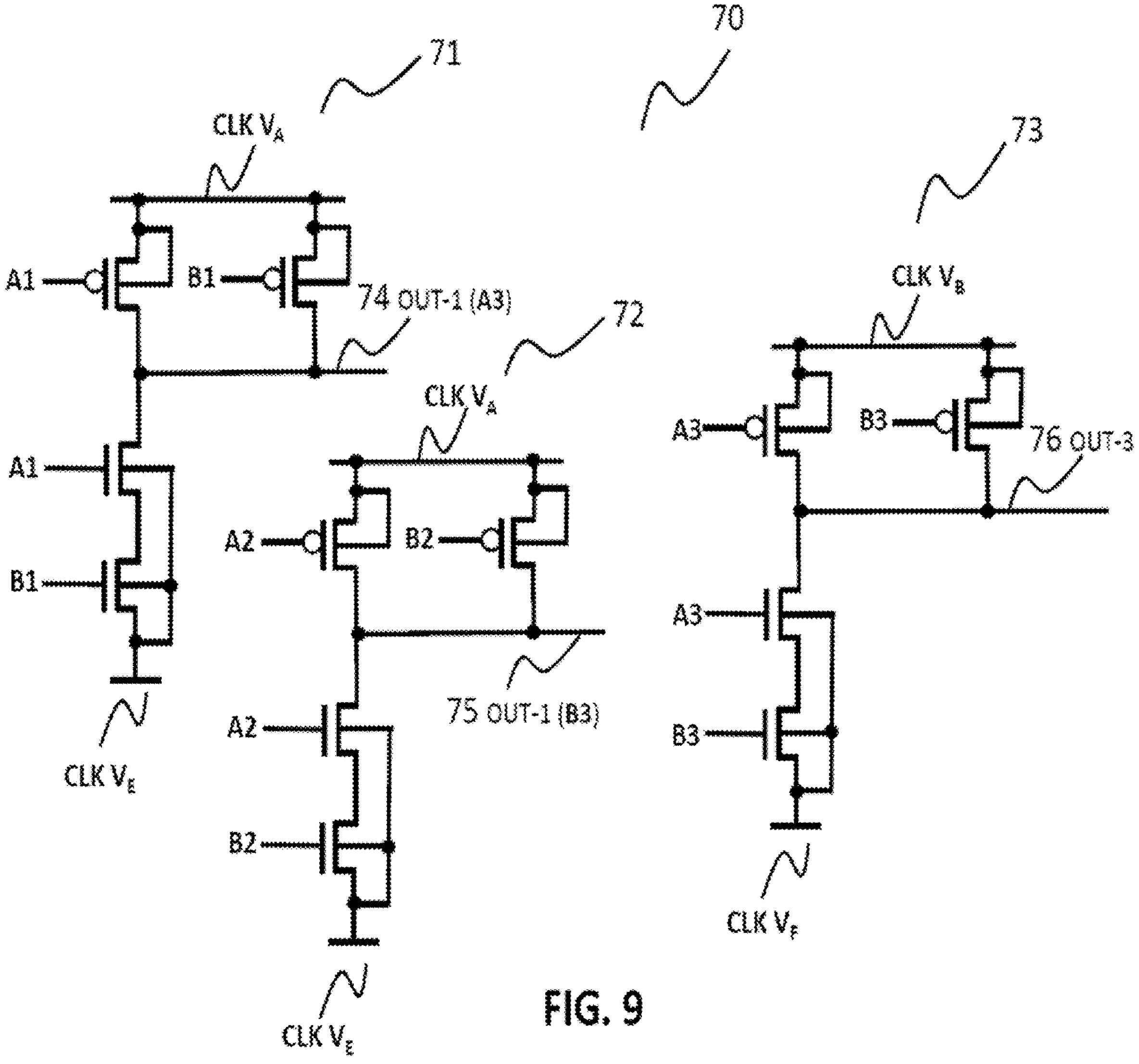
FIG. 9 is a schematic diagram of three NAND gates configured in quasi-adiabatic fashion.

FIG. 9 is a schematic diagram of three NAND gates configured in quasi-adiabatic fashion. In FIG. 9, both quasi-adiabatic NAND gates 71 and 72 are configured as phase A devices and quasi-adiabatic NAND gate 73 is configured as a phase B device. This configuration is appropriate in the depicted embodiment, as the outputs generated by quasi-adiabatic NAND gates 71 and 72 are provided as inputs for quasi-adiabatic NAND gate 73. Such a phased sequence of NAND gates functions like a pipelined architecture, but without the clocked-registers of such a pipelined architecture. The number N of sinusoidal power signals in the phased sequence of sinusoidal power signals $V_A$-$V_N$ can be selected so that the gate delay TGD of the quasi-adiabatic logic gates is coordinated with the time between phases $1/(Nf_{POWER})$ to optimize speed of the quasi-adiabatic circuit. For example, the time between phases $1/(Nf_{POWER})$ could be approximately equal to the gate delay TGD at the worst corner (e.g., processing and temperature conditions) of operation. In some embodiments, the time between adjacent phases $1/(Nf_{POWER})$ can be between one and two times the gate delay TGD.

In an example, a QAL logic circuit can be configured for use in a pipelined system without requiring the addition of additional circuitry (e.g., additional registers, additional clock signals, additional clock generators). For example, because each QAL logic gate can individually clocked, and/or because data passes through QAL logic gates sequentially, the circuit can be employed for pipelined operations. This can help to reduce the size and/or increase the density of a circuit using QAL.

In some examples, quasi-adiabatic logic circuits can be configured to implement sequential logic functions, such as state machines and/or counters. A state machine can operates on a clock-by-clock basis, transitioning between states in response to clock edges. In quasi-adiabatic implementations, such state machines can operate on a single clock phase basis (e.g., a "Clock-A basis"), where state-holding elements are powered by a common one of the plurality of sinusoidal power signals (e.g., VA and VE). For example, a quasi-adiabatic counter circuit can include a plurality of quasi-adiabatic flip-flops or latches, respectively powered by the same clock phase, such that the counter increments or decrements synchronously with each cycle of that clock phase. Combinational logic between state-holding elements can be powered by intermediate clock phases to satisfy timing requirements. This clock-phase-aligned architecture can help enable the quasi-adiabatic implementations of finite state machines, counters, shift registers, and other sequential logic circuits while maintaining the power efficiency benefits of quasi-adiabatic operation.

Figure 10:
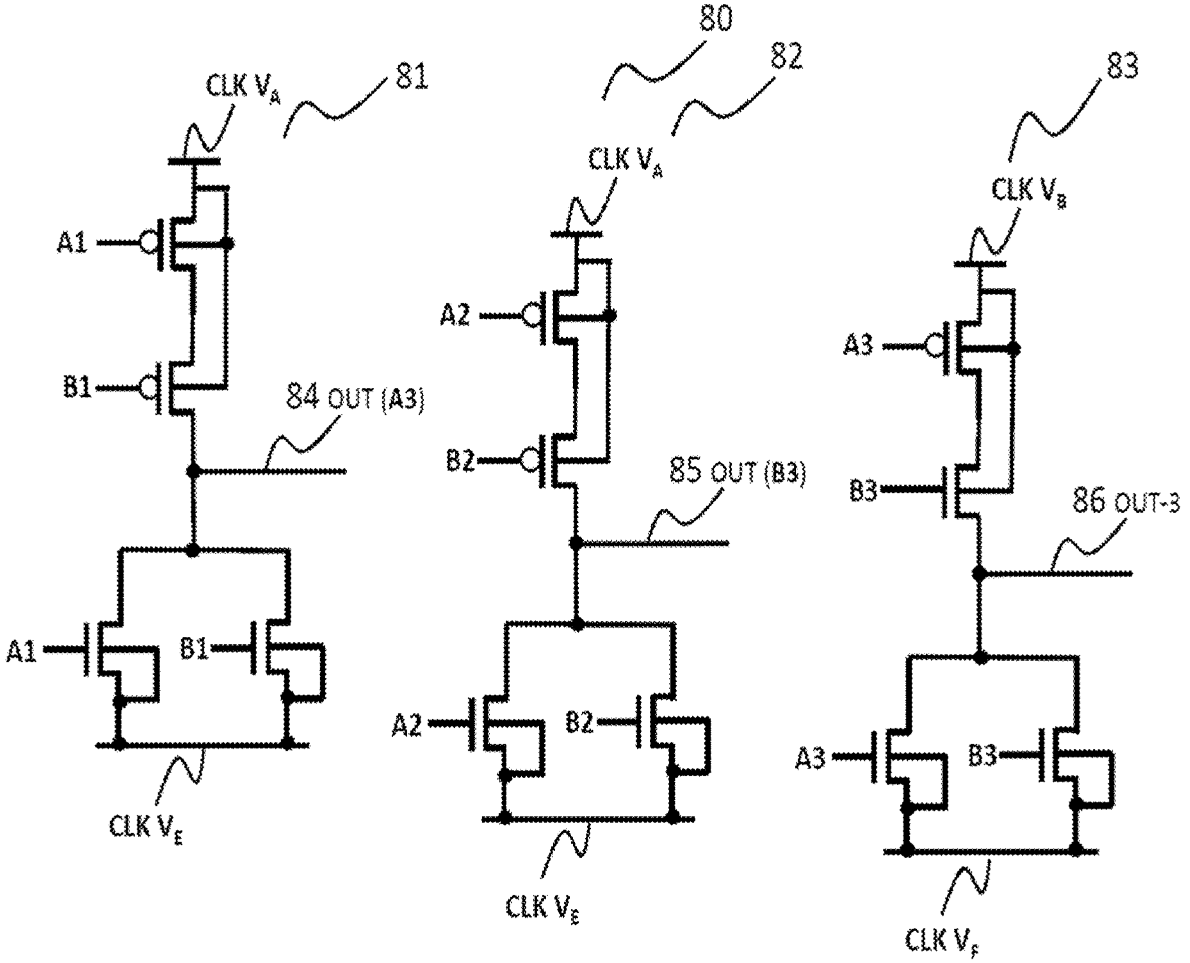
FIG. 10 is a schematic diagram of three NOR gates configured in quasi-adiabatic fashion.

FIG. 10 is a schematic diagram of three NOR gates configured in quasi-adiabatic fashion. In FIG. 10, both quasi-adiabatic NOR gates 81 and 82 are configured as phase A devices and quasi-adiabatic NOR gate 83 is configured as a phase B device. Again, this configuration is appropriate in the depicted embodiment, as the outputs generated by quasi-adiabatic NOR gates 81 and 82 are provided as inputs for quasi-adiabatic NOR gate 83.

Figure 11:
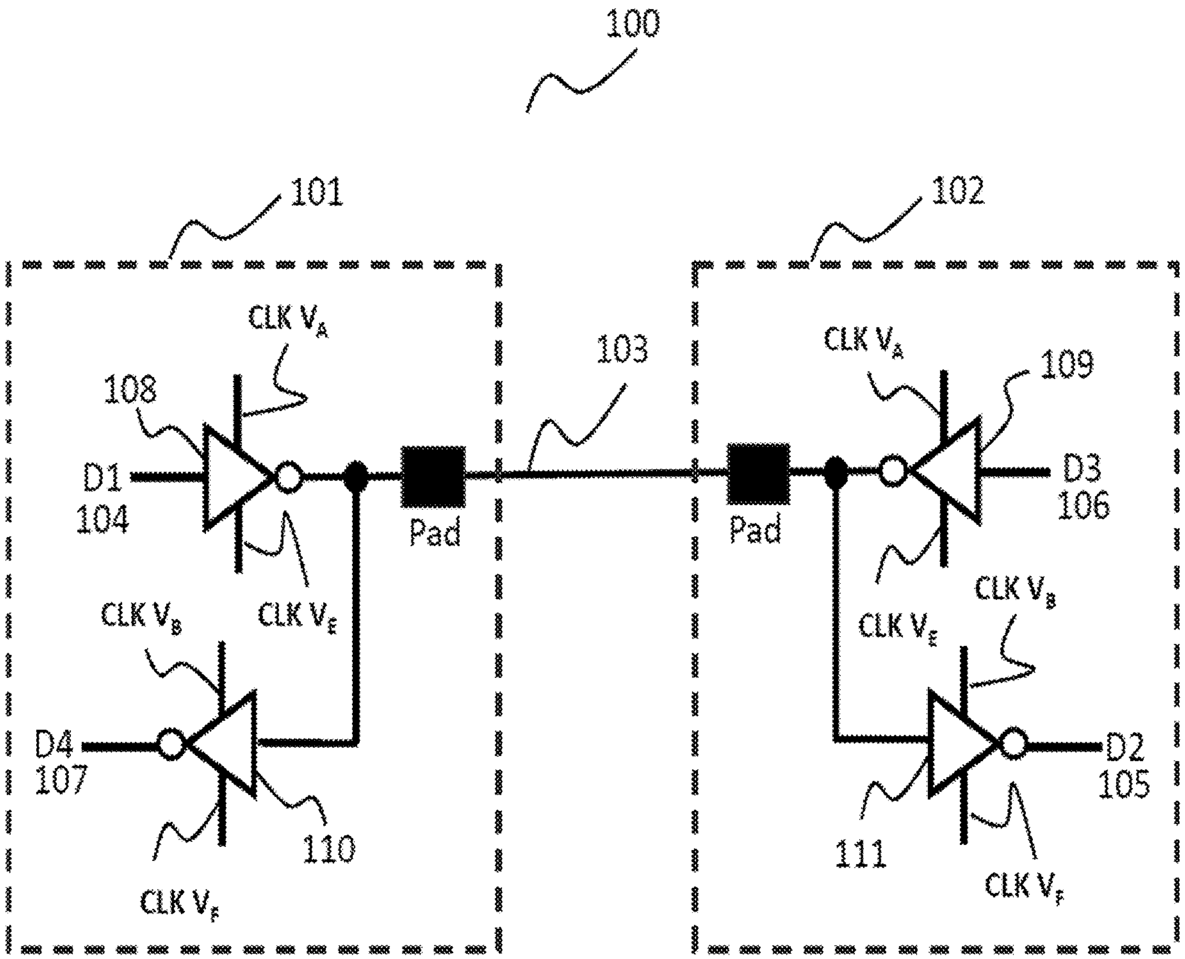
FIG. 11 is a schematic diagram of two bi-directional I/O circuits configured in quasi-adiabatic fashion.

FIG. 11 is a schematic diagram of two bi-directional I/O circuits configured in quasi-adiabatic fashion for data communications between first integrated circuit 101 and second integrated circuit 102 operating on synchronized sinusoidal power signals. On first IC 101, data D1 at node 104 enters tristate buffer 108, which is powered by sinusoidal power signal $V_A$. An output signal provided by tristate buffer 108 is conductively transmitted, via interconnect 103, to second IC 102. Receiving buffer 111 of second IC 102 is powered by sinusoidal power signal $V_B$ which is the appropriately phased sinusoidal power signal to receive the signal. The output of receiving buffer 111 is data D2 at node 105. Similarly, on second IC 102, data D3 at node 106 enters tristate buffer 109, which is powered by sinusoidal power signal $V_A$. An output signal provided by tristate buffer 109 is conductively transmitted, via interconnect 103, to first IC 101. Receiving buffer 110 of first IC 101 is powered by sinusoidal power signal $V_B$ which is the appropriately phased sinusoidal power signal to receive the signal. The output of receiving buffer 110 is data D4 at node 107.

Figure 12:
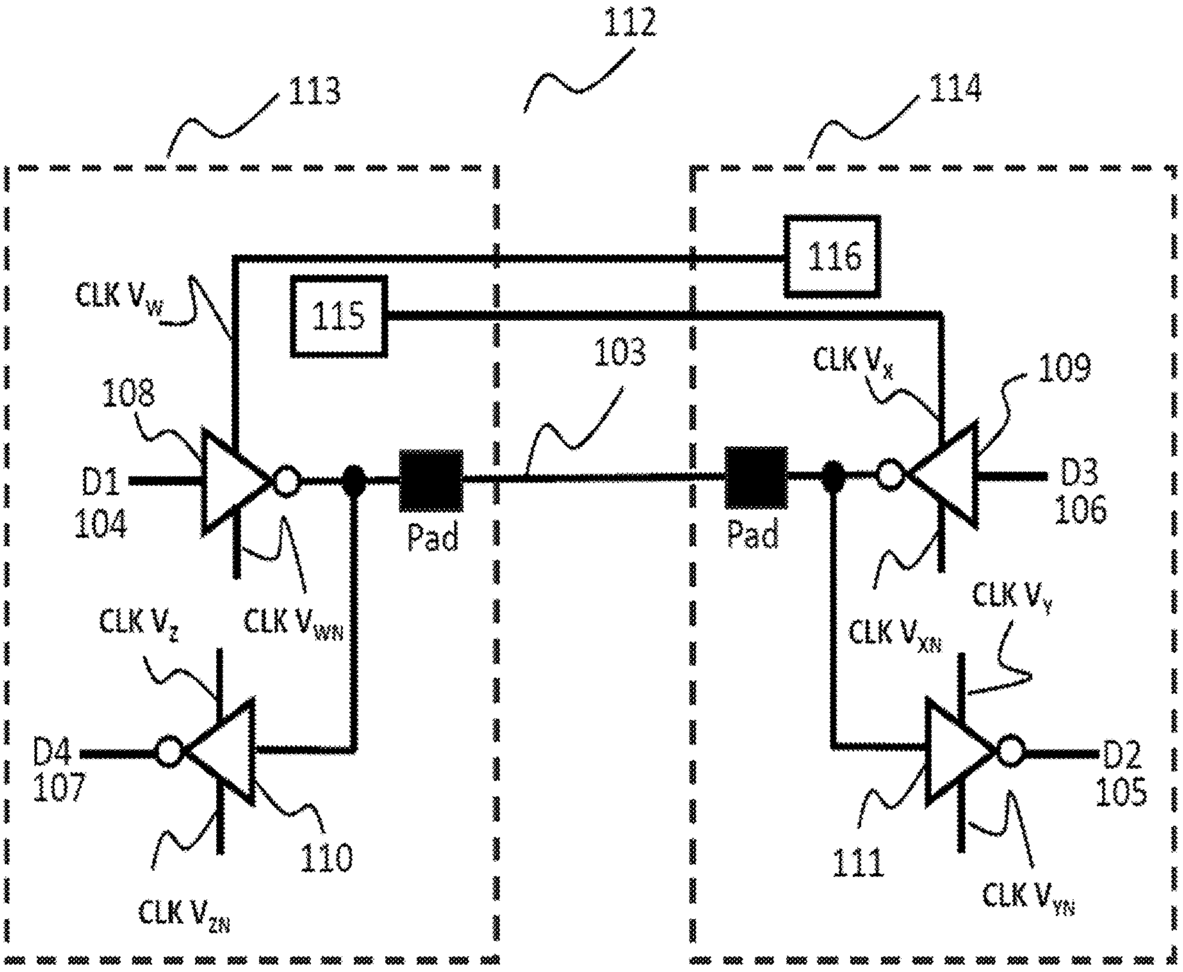
FIG. 12 is a schematic diagram of two bi-directional I/O circuits with clock synchronization logic configured in quasi-adiabatic fashion.

FIG. 12 is a schematic diagram of two bi-directional I/O circuits with clock synchronization logic configured in quasi-adiabatic fashion for data communications between first integrated circuit 113 and second integrated circuit 114. On first IC 113, data D1 at node 104 enters tristate buffer 108, which is powered by sinusoidal power signals $V_W$ and $V_{WN}$. An output signal provided by tristate buffer 108 is conductively transmitted, via interconnect 103, to second IC 114. Clock synchronization logic 116 assesses which phased clocks ($V_Y$ and $V_{YN}$) would be appropriate to power receiving buffer 111 for receiving data from tristate buffer 108 of first IC 113. Receiving buffer 111 of second IC 114 is then powered by sinusoidal clock signals $V_Y$ and $V_{YN}$, which are the appropriately phased sinusoidal power signals to receive the signal. The output of receiving buffer 111 is data D2 at node 105. Similarly, on second IC 114, data D3 at node 106 enters tristate buffer 109, which is powered by sinusoidal power signals $V_X$ and $V_{XN}$. An output signal provided by tristate buffer 109 is conductively transmitted, via interconnect 103, to first IC 113. Receiving buffer 110 of first IC 113 is powered by sinusoidal clock signals $V_Z$ and $V_{ZN}$, which are the appropriately phased sinusoidal power signals to receive the signal. The output of receiving buffer 110 is data D4 at node 107. Clock synchronization logic 115 assesses which phased clocks ($V_Z$ and $V_{ZN}$) would be appropriate to power receiving buffer 110 for receiving data from tristate buffer 109 on the second IC 114.

When transferring signals between quasi-adiabatic logic circuits and other circuit types (e.g., CMOS circuits), it can be desirable to satisfy the specified setup and/or specified hold time of the receiving circuit. For example, data can be lost and/or data integrity can be compromised if the data is not provided to the quasi-adiabatic logic circuit for a long enough time when transitioning from another circuit type to QAL. Alternatively or additionally, data can be lost and/or data integrity can be compromised if if data is not provided to the other circuit for a long enough time when transitioning from QAL to another circuit type. For example, for QAL-to-CMOS transfers, the output signal from the quasi-adiabatic logic circuit can be configured to be stable for at least the setup time before the CMOS circuit's clock edge and can be configured to remain stable for at least the hold time after the clock edge. For CMOS-to-QAL transfers, the CMOS output signal can be configured to remain stable relative to the phase of the sinusoidal power signal received by the quasi-adiabatic logic gate. The I/O interface circuits 70 and 80 described with reference to FIGS. 12 and 13 can facilitate these transfers by providing appropriate signal conditioning and timing alignment.

Figure 13:
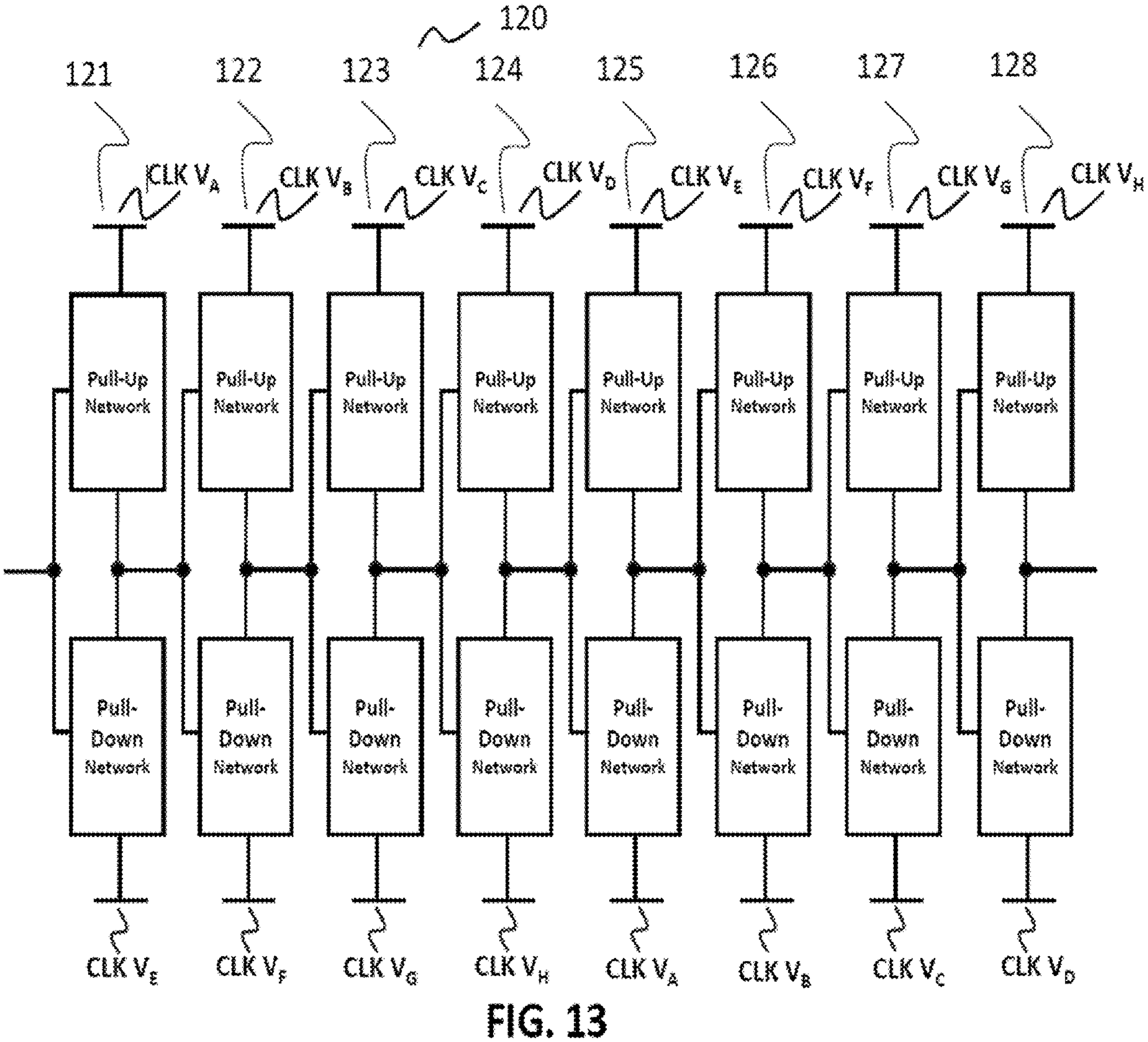
FIG. 13 is a schematic diagram of eight logic gates configured in quasi-adiabatic fashion.

FIG. 13 is a schematic diagram of eight logic gates configured in quasi-adiabatic fashion 120. The sequence of sinusoidal power signals shown in FIG. 13 is naturally balanced. For example, first logic gate 121 has sinusoidal power signal $V_A$ providing power to the pull-up network and has sinusoidal power signal $V_E$ providing power to the pull-down network. Whereas fifth logic gate 125 has sinusoidal power signal $V_E$ providing power to the pull-up network and has sinusoidal power signal $V_A$ providing power to the pull-down network. When sinusoidal power signal $V_A$ is high, on the first quarter cycle, sinusoidal power signal $V_A$ provides electrical current to logic gate 121 for pulling up its output node if the input signals thereto dictate such a logic state. On the second quarter cycle, sinusoidal power signal $V_A$ receives electrical current from logic gate 121. During the third quarter cycle, sinusoidal power signal $V_A$ receives current from logic gate 125 for pulling down its output node if the input signals thereto dictate such a logic state. Then, during the fourth quarter cycle, sinusoidal power signal $V_A$ provides electrical current to logic gate 125. Thus, during this period or cycle of sinusoidal power signal $V_A$, electrical current is supplied to and then returned from the capacitive loads of logic gates 121 and 125.

Similarly, When sinusoidal power signal $V_A$ is high, on the first quarter cycle, sinusoidal power signal $V_E$ provides electrical current to logic gate 125 for pulling up its output node if the input signals thereto dictate such a logic state. On the second quarter cycle, sinusoidal power signal $V_E$ receives electrical current from logic gate 125. During the third quarter cycle, sinusoidal power signal $V_E$ receives current from logic gate 121 for pulling down its output node if the input signals thereto dictate such a logic state. Then, during the fourth quarter cycle, sinusoidal power signal $V_E$ provides electrical current to logic gate 121. Thus, during this period or cycle of sinusoidal power signal $V_E$, electrical current is supplied to and then returned from the capacitive loads of logic gates 121 and 125.

A QAL circuit (e.g., employing two or more sinusoidal clocks) can be coupled to a non-QAL circuit (e.g., employing a square wave clock, employing a single clock signal), such as to pass data from the QAL circuit to the non-QAL circuit or vice versa. In the example of a QAL circuit providing data to a non-QAL circuit, the non-QAL circuit can be configured to receive (e.g., sample) the data when the QAL data node is within a specified portion of the hold phase, which can include being anywhere within the hold phase, being within the middle 50 percent of the hold phase, being within the middle 25 percent of the hold phase, being within a time wherein the output voltage is above 50 percent of the maximum output voltage, etc. In the example of a non-QAL circuit providing data to a QAL circuit, the QAL circuit can be configured to receive the data during the setup phase.

To implement the quasi-adiabatic logic (QAL) described herein for VLSI designs, custom libraries of cells can be developed for the respective process node. Modifying a conventional CMOS standard cell library to a QAL standard cell library can be performed by modifying the power ($V_{DD}$) connections to the various phases of sinusoidal power signals and the ground ($V_{SS}$) connections to the corresponding complementary sinusoidal power signals. The connections to the bodies of the transistors may differ depending on the process technology and the specific embodiment of quasi-adiabatic logic implemented.

The quasi-adiabatic chip technology disclosed herein can provide many benefits over traditional CMOS technologies. Quasi-adiabatic logic can be used to minimize energy consumption while maintaining high performance. Quasi-adiabatic logic can be seamlessly integrated into a wide array of devices, from laptops and smartphones to data center servers and communication equipment. These low-power chips can enhance efficiency across the spectrum of computing applications. By enabling extended battery life and reducing heat generation, these chips address critical challenges faced by modern technology. As a result, they can serve as a foundational component for various computing systems, supporting a diverse range of functionalities. These computing systems may include, but are not limited to: mainframe computers, blockchain equipment including cryptocurrency miners (for coins such as Bitcoin, Litecoin, Ethereum and others), AI training and inferencing servers, engineering workstations, AI training and inferencing at the edge devices, desktop and laptop computers, gaming computers, augmented reality/virtual reality/mixed reality headsets, datacenter/cloud servers, networking equipment, data storage equipment, video processing/rendering equipment, audio processing equipment, optical and wireless communications equipment, lightweight cryptography, data encryption processing systems, fully homomorphic encryption (FHE) systems, advanced driver-assistance systems (ADAS), mobile phones, tablets, smart watches, flat panel monitors, televisions, cable boxes, lidar systems, robotic systems, point-of-sale equipment, on-line payment and transaction systems, automated trading systems, cybersecurity systems, fraud detection systems, digital banking platforms, crowdfunding platforms, embedded medical devices, hearing aids and more.

Computing systems in datacenters can be employed to provide cloud computing services to a variety of customers. Lower power integrated circuits with the quasi-adiabatic logic described herein, if incorporated into such computing systems, would lower the operating costs of datacenters and allow lower pricing of cloud services to customers, providing a competitive advantage to the cloud service provider. Cloud services encompass a wide range of offerings, including Infrastructure-as-a-Service (IaaS), Platform-as-a-Service (PaaS), and Software-as-a-Service (SaaS). Hence, the invention disclosed herein is intended to cover the method of providing cloud services comprising the use of quasi-adiabatic circuits, per claim 1, to process data and execute applications for a variety of cloud service including, but not limited to, AI inferencing, AI training, blockchain transactions, video processing, audio processing, cryptocurrency mining, and financial transactions. The low power processing provides the value to the cloud service provider who may be located in a separate geographical country compared to the physical location of the computing systems in the cloud datacenter While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The following, non-limiting examples, detail certain aspects of the present subject matter to solve the challenges and provide the benefits discussed herein, among others.

EXAMPLES

Example 1 is a quasi-adiabatic logic circuit comprising: a sinusoidal power generating circuit configured to generate a plurality of sinusoidal power signals of a common frequency evenly phase distributed over 360° in a modulo phased sequence, each of the plurality of sinusoidal power signals having a phase lagging the phase of a previous one of the modulo phased sequence and leading the phase of a following one of the modulo phased sequence by a delta phase angle $\Delta\theta$; and a plurality of quasi-adiabatic logic gates daisy-chain connected output-to-input, each of the plurality of quasi-adiabatic logic gates powered by a corresponding one of the plurality of sinusoidal power signals, each of the plurality of quasi-adiabatic logic gates including: one or more logic input terminals configured to receive one or more corresponding logic input signals; and a logic output terminal configured to provide a logic output signal, wherein the logic output signal is characterized by the phase of the corresponding one of the plurality of sinusoidal power signals providing power thereto.

In Example 2, the subject matter of Example 1 optionally includes wherein each of the plurality of quasi-adiabatic logic gates is configured to receive one or more corresponding logic input signals characterized by the phase leading, by the delta phase angle $\Delta\theta$, the phase characterizing the logic output signal provided thereby.

In Example 3, the subject matter of any one or more of Examples 1-2 optionally include °/N.

In Example 4, the subject matter of Example 3 optionally includes wherein the plurality of sinusoidal power signals is four or more sinusoidal power signals, each with a phase different from the phases of others of the plurality of sinusoidal power signals.

In Example 5, the subject matter of Example 4 optionally includes wherein the plurality of sinusoidal power signals is eight or more sinusoidal power signals, each with a phase different from the phases of others of the plurality of sinusoidal power signals.

In Example 6, the subject matter of any one or more of Examples 3-5 optionally include-N of a second half of the even number of sinusoidal power signals.

In Example 7, the subject matter of any one or more of Examples 3-6 optionally include mod N).

In Example 8, the subject matter of Example 7 optionally includes ° out of phase with one another.

In Example 9, the subject matter of any one or more of Examples 3-8 optionally include wherein each of the plurality of quasi-adiabatic logic gates has a logic-resolving phase in response to the sinusoidal power signal providing power thereto being of a first polarity.

In Example 10, the subject matter of Example 9 optionally includes wherein during the logic resolving phase the output signal provided by the quasi-adiabatic logic gate is indicative of a logic function for which the quasi-adiabatic logic gate is configured.

In Example 11, the subject matter of any one or more of Examples 5-10 optionally include °.

In Example 12, the subject matter of any one or more of Examples 5-11 optionally include °.

In Example 13, the subject matter of any one or more of Examples 1-12 optionally include wherein each of the plurality of quasi-adiabatic logic gates is a quasi-adiabatic logic gate.

In Example 14, the subject matter of Example 13 optionally includes wherein each of the phased sequence of quasi-adiabatic logic gates includes: a pullup network including one or more pullup transistors configured to perform a pullup logic function, each of the one or more pullup transistors of the pullup network having a control node coupled to a one of the one of the one or more logic input terminals, the pullup network configured to modulate conductivity between the first power node and the logic output terminal based on the pullup logic function that the pullup network is configured to perform and the logic input signals received on the one or more logic input terminals; and a pulldown network including one or more pulldown transistors configured to perform a pulldown logic function complementary to the pullup logic function, each of the one or more pulldown transistors of the pulldown network having a control node coupled to one of the one or more logic input terminals, the pulldown network configured to modulate conductivity between the second power node and the logic output terminal based on the pulldown logic function that the pulldown network is configured to perform and the logic input signals received on the logic input terminals.

In Example 15, the subject matter of Example 14 optionally includes wherein a peak-to-peak amplitude of each of the plurality of sinusoidal power signals is less than a sum of threshold voltages of the pullup and pulldown transistors VTHN+VTHP of the plurality of quasi-adiabatic logic gates.

In Example 16, the subject matter of any one or more of Examples 14-15 optionally include wherein the pullup transistors comprise PMOS transistors, each having a body node driven by one of the plurality of sinusoidal power signals.

In Example 17, the subject matter of any one or more of Examples 14-16 optionally include wherein the pullup transistors comprise PMOS transistors, each having a body node biased by a sinusoidal signal that maintain reverse-biasing of parasitic junctions of the body.

In Example 18, the subject matter of any one or more of Examples 14-17 optionally include wherein the pulldown transistors comprise NMOS transistors, each having a body node driven by one of the plurality of sinusoidal power signals.

In Example 19, the subject matter of any one or more of Examples 13-18 optionally include wherein the pulldown transistors comprise NMOS transistors, each having a body node biased by a sinusoidal signal that maintain reverse-biasing of parasitic junctions of the body.

In Example 20, the subject matter of any one or more of Examples 1-19 optionally include a plurality of tuning capacitors selectively coupled across power terminals receiving operating power for the quasi-adiabatic logic circuit; and a tuning controller that selectively couples one or more selected ones of the plurality of tuning capacitors across the power terminals, the one or more selected ones selected such that a resonant frequency fRESONANCE of a tank circuit including an inductor conductively coupled across the power terminals is substantially equal to a frequency fPOWER of one of the phased sequence of sinusoidal power signals provided across the power terminals.

In Example 21, the subject matter of any one or more of Examples 1-20 optionally include an LC tank circuit conductively coupled across power nodes of quasi-adiabatic logic circuitry that is simultaneously receiving the sinusoidal power signal thereacross.

In Example 22, the subject matter of any one or more of Examples 1-21 optionally include wherein a time between adjacent phases is between one and two times a gate delay of the quasi-adiabatic logic gates.

Example 23 is a quasi-adiabatic logic circuit comprising: a clock generation circuit, configured to generate a plurality of clock signals phase-distributed over 360° in a modulo phased sequence, each respective one of the plurality of clock signals having a phase lagging a phase of a previous one of the modulo phased sequence and leading a phase of a following one of the modulo phased sequence; and a plurality of quasi-adiabatic logic gates respectively powered by corresponding ones of the plurality of clock signals.

In Example 24, the subject matter of Example 23 optionally includes wherein the plurality of quasi-adiabatic logic gates are daisy-chain connected output-to-input, wherein a first clock signal powering a first quasi-adiabatic logic gate generating a respective output phase-leads a second clock signal powering a second quasi-adiabatic logic gate that receives the respective output.

In Example 25, the subject matter of Example 24 optionally includes wherein the plurality of quasi-adiabatic logic gates respectively include inverters.

In Example 26, the subject matter of Example 25 optionally includes wherein the quasi-adiabatic logic circuit includes a static random access memory (SRAM) cell including the plurality of quasi-adiabatic logic gates.

In Example 27, the subject matter of Example 26 optionally includes write circuitry, configured to write data to the SRAM cell; and read circuitry, configured to read data from the SRAM cell.

In Example 28, the subject matter of Example 27 optionally includes a plurality of SRAM cells arranged to form an SRAM element array; cell selection decoder logic, configured to index a specified one of the plurality of SRAM cells for at least one of a read or write action; and data decoder logic, configured to at least one of receive the data from or provide the data to the specified one of the plurality of SRAM cells.

In Example 29, the subject matter of any one or more of Examples 23-28 optionally include wherein each respective logic gate of the plurality of quasi-adiabatic logic gates comprises: a logic output terminal configured to provide a logic output signal, wherein the logic circuit is configured so that the logic output signal is characterized by a phase of a corresponding one of the plurality of clock signals providing power to that respective logic gate.

In Example 30, the subject matter of any one or more of Examples 23-29 optionally include wherein the plurality of quasi-adiabatic logic gates are respectively configured to be powered by the corresponding ones of the plurality of clock signals and a complement of the corresponding respective ones of the plurality of clock signals.

In Example 31, the subject matter of Example 30 optionally includes wherein a complement of an individual one of the plurality of clock signals comprises an individual one of the plurality of clock signals.

In Example 32, the subject matter of any one or more of Examples 23-31 optionally include wherein the plurality of clock signals respectively have substantially a same duty cycle and substantially a same frequency.

In Example 33, the subject matter of Example 32 optionally includes wherein the plurality of clock signals respectively have a duty cycle that is substantially 50 percent.

In Example 34, the subject matter of Example 33 optionally includes wherein the clock generation circuit is configured generate the plurality of clock signals so that respective ones of the plurality of clock signals are substantially sinusoidal.

In Example 35, the subject matter of Example 34 optionally includes degrees of phase.

In Example 36, the subject matter of any one or more of Examples 23-35 optionally include wherein the circuit is configured such that a logic state of individual ones of the plurality of quasi-adiabatic logic gates is switched when a source voltage across the individual one of the plurality of quasi-adiabatic logic gates is at least one of substantially zero or less than zero.

In Example 37, the subject matter of Example 36 optionally includes wherein the circuit is configured such that a gate voltage of one or more transistors included in the individual ones of the plurality of quasi-adiabatic logic gates is switched when a source-to-drain voltage of respective transistors is at least one of substantially zero or less than zero.

In Example 38, the subject matter of any one or more of Examples 23-37 optionally include wherein the quasi-adiabatic logic circuit does not include a ground pin.

In Example 39, the subject matter of any one or more of Examples 23-38 optionally include a CMOS (complimentary "metal" oxide semiconductor) transistor configuration, wherein one transistor in the CMOS transistor configuration is arranged at least partially above an other transistor in the CMOS transistor configuration.

In Example 40, the subject matter of Example 39 optionally includes wherein the other transistor in the CMOS configuration is in a substrate and the other transistor in the CMOS configuration is above the substrate.

In Example 41, the subject matter of any one or more of Examples 39-40 optionally include wherein both transistors in the CMOS configuration are above a substrate.

In Example 42, the subject matter of any one or more of Examples 23-41 optionally include wherein the plurality of quasi-adiabatic logic gates are configured to operate in a pipelined fashion.

In Example 43, the subject matter of any one or more of Examples 24-42 optionally include wherein he plurality of quasi-adiabatic logic gates are configured to operate in a pipelined fashion without using storage registers between respective logic gates.

Example 44 is a quasi-adiabatic logic circuit comprising: a plurality of quasi-adiabatic logic gates respectively powered by corresponding ones of a plurality of clock signals, wherein the quasi-adiabatic logic gates are respectively configured to receive respective ones of the plurality of clock signals from: a clock generation circuit, configured to generate the plurality of clock signals phase-distributed over 360° in a modulo phased sequence, each respective one of the plurality of clock signals having a phase lagging a phase of a previous one of the modulo phased sequence and leading a phase of a following one of the modulo phased sequence.

Example 45 is a quasi-adiabatic logic circuit comprising: a sinusoidal power generating circuit configured to generate a plurality of sinusoidal power signals of a common frequency evenly phase distributed over 360° in a modulo phased sequence, each of the plurality of sinusoidal power signals having a phase lagging the phase of a previous one of the modulo phased sequence and leading the phase of a following one of the modulo phased sequence by a delta phase angle $\Delta\theta$; a plurality of quasi-adiabatic logic gates daisy-chain connected output-to-input, each of the plurality of quasi-adiabatic logic gates powered by a corresponding one of the plurality of sinusoidal power signals, each of the plurality of quasi-adiabatic logic gates including: one or more logic input terminals configured to receive one or more corresponding logic input signals; and a logic output terminal configured to provide a logic output signal, wherein the logic output signal is characterized by the phase of the corresponding one of the plurality of sinusoidal power signals providing power thereto; a plurality of tuning capacitors selectively coupled across power terminals receiving operating power for the quasi-adiabatic logic circuit; and a tuning controller that selectively couples one or more selected ones of the plurality of tuning capacitors across the power terminals, the one or more selected ones selected such that a resonant frequency fRESONANCE of a tank circuit including an inductor conductively coupled across the power terminals is substantially equal to a frequency fPOWER of one of the phased sequence of sinusoidal power signals provided across the power terminals.

Example 46 is a method for operating a quasi-adiabatic logic circuit, the method comprising: generating a plurality of clock signals phase-distributed over 360° in a modulo phased sequence, each respective one of the plurality of clock signals having a phase lagging a phase of a previous one of the modulo phased sequence and leading a phase of a following one of the modulo phased sequence; respectively powering a plurality of quasi-adiabatic logic gates using corresponding ones of the plurality of clock signals; and switching respective transistors within respective ones of the quasi-adiabatic logic gates when a drain-to-source bias voltage across the respective transistors is substantially zero.

Example 47 is a method for operating a quasi-adiabatic logic circuit, the method comprising: generating a plurality of clock signals phase-distributed over 360° in a modulo phased sequence, each respective one of the plurality of clock signals having a phase lagging a phase of a previous one of the modulo phased sequence and leading a phase of a following one of the modulo phased sequence; respectively powering a plurality of quasi-adiabatic logic gates using corresponding ones of the plurality of clock signals; and storing energy released as respective ones of the quasi-adiabatic logic gates are drain-to-source un-biased in a resonant circuit.

Example 48 is at least one machine-readable medium including instructions that, when executed by processing circuitry, cause the processing circuitry to perform operations to implement of any of Examples 1-47.

Example 49 is an apparatus comprising means to implement of any of Examples 1-47.

Example 50 is a system to implement of any of Examples 1-47.

Example 51 is a method to implement of any of Examples 1-47.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific examples that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the terms "or" and "and/or" are used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5). Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the examples should be determined with reference to the appended claims, along with the full scope of equivalents to which such claims are entitled.

The invention claimed is:

1. A quasi-adiabatic logic circuit comprising:

a sinusoidal power generating circuit configured to generate a plurality of sinusoidal power signals of a common frequency evenly phase distributed over 360° in a modulo phased sequence, each of the plurality of sinusoidal power signals having a phase lagging the phase of a previous one of the modulo phased sequence and leading the phase of a following one of the modulo phased sequence by a delta phase angle Δθ; and a plurality of quasi-adiabatic logic gates daisy-chain connected output-to-input, each of the plurality of quasi-adiabatic logic gates powered by a corresponding one of the plurality of sinusoidal power signals, each of the plurality of quasi-adiabatic logic gates including:

one or more logic input terminals configured to receive one or more corresponding logic input signals; and a logic output terminal configured to provide a logic output signal, wherein the logic output signal is characterized by the phase of the corresponding one of the plurality of sinusoidal power signals providing power thereto.

2. The quasi-adiabatic logic circuit of claim 1, wherein each of the plurality of quasi-adiabatic logic gates is configured to receive one or more corresponding logic input signals characterized by the phase leading, by the delta phase angle Δθ, the phase characterizing the logic output signal provided thereby.

3. The quasi-adiabatic logic circuit of claim 1, wherein the plurality of sinusoidal power signals is an even number N of sinusoidal power signals, thereby defining the delta phase angle Δθ of 360°/N.

4. The quasi-adiabatic logic circuit of claim 1, wherein each of the phased sequence of quasi-adiabatic logic gates includes:

a pullup network including one or more pullup transistors configured to perform a pullup logic function, each of the one or more pullup transistors of the pullup network having a control node coupled to a one of the one of the one or more logic input terminals, the pullup network configured to modulate conductivity between a first power node and the logic output terminal based on the pullup logic function that the pullup network is configured to perform and the logic input signals received on the one or more logic input terminals; and a pulldown network including one or more pulldown transistors configured to perform a pulldown logic function complementary to the pullup logic function, each of the one or more pulldown transistors of the pulldown network having a control node coupled to one of the one or more logic input terminals, the pulldown network configured to modulate conductivity between a second power node and the logic output terminal based on the pulldown logic function that the pulldown network is configured to perform and the logic input signals received on the logic input terminals.

5. The quasi-adiabatic logic circuit of claim 1, further comprising:

a plurality of tuning capacitors selectively coupled across power terminals receiving operating power for the quasi-adiabatic logic circuit; and a tuning controller that selectively couples one or more selected ones of the plurality of tuning capacitors across the power terminals, the one or more selected ones selected such that a resonant frequency $f_{RESONANCE}$ of a tank circuit including an inductor conductively coupled across the power terminals is substantially equal to a frequency $f_{POWER}$ of one of the phased sequence of sinusoidal power signals provided across the power terminals.

6. The quasi-adiabatic logic circuit of claim 1, further comprising:

an LC tank circuit conductively coupled across power nodes of quasi-adiabatic logic circuitry that is simultaneously receiving the sinusoidal power signal thereacross.

7. The quasi-adiabatic logic circuit of claim 1, wherein a time between adjacent phases is between one and two times a gate delay of the quasi-adiabatic logic gates.

8. A quasi-adiabatic logic circuit comprising:

a clock generation circuit, configured to generate a plurality of clock signals phase-distributed over 360° in a modulo phased sequence, each respective one of the plurality of clock signals having a phase lagging a phase of a previous one of the modulo phased sequence and leading a phase of a following one of the modulo phased sequence; and a plurality of quasi-adiabatic logic gates respectively powered by corresponding ones of the plurality of clock signals.

9. The quasi-adiabatic logic circuit of claim 8, wherein the plurality of quasi-adiabatic logic gates are daisy-chain connected output-to-input, wherein a first clock signal powering a first quasi-adiabatic logic gate generating a respective output phase-leads a second clock signal powering a second quasi-adiabatic logic gate that receives the respective output.

10. The quasi-adiabatic logic circuit of claim 8, wherein each respective logic gate of the plurality of quasi-adiabatic logic gates comprises:

a logic output terminal configured to provide a logic output signal, wherein the logic circuit is configured so that the logic output signal is characterized by a phase of a corresponding one of the plurality of clock signals providing power to that respective logic gate.

11. The quasi-adiabatic logic circuit of claim 8, wherein the plurality of quasi-adiabatic logic gates are respectively configured to be powered by the corresponding ones of the plurality of clock signals and a complement of the corresponding respective ones of the plurality of clock signals.

12. The quasi-adiabatic logic circuit of claim 8, wherein the plurality of clock signals respectively have substantially a same duty cycle and substantially a same frequency.

13. The quasi-adiabatic logic circuit of claim 8, wherein the circuit is configured such that a logic state of individual ones of the plurality of quasi-adiabatic logic gates is switched when a source voltage across the individual one of the plurality of quasi-adiabatic logic gates is at least one of substantially zero or less than zero.

14. The quasi-adiabatic logic circuit of claim 8, wherein the quasi-adiabatic logic circuit does not include a ground pin.

15. The quasi-adiabatic logic circuit of claim 8, wherein the plurality of quasi-adiabatic logic gates are configured to operate in a pipelined fashion.

16. The quasi-adiabatic logic circuit of claim 15, wherein the plurality of quasi-adiabatic logic gates are configured to operate in a pipelined fashion without using storage registers between respective logic gates.

17. A method for operating a quasi-adiabatic logic circuit, the method comprising:

generating a plurality of clock signals phase-distributed over 360° in a modulo phased sequence, each respective one of the plurality of clock signals having a phase lagging a phase of a previous one of the modulo phased sequence and leading a phase of a following one of the modulo phased sequence;

respectively powering a plurality of quasi-adiabatic logic gates using corresponding ones of the plurality of clock signals; and switching respective transistors within respective ones of the quasi-adiabatic logic gates when a drain-to-source bias voltage across the respective transistors is substantially zero.

18. The method of claim 17, comprising:

storing energy released as respective ones of the quasi-adiabatic logic gates are drain-to-source un-biased in a resonant circuit.

19. The method of claim 17, comprising:

transferring a signal from a quasi-adiabatic logic circuit to a CMOS circuit, including:

generating an output signal at an output node of one of the plurality of quasi-adiabatic logic gates;

providing the output signal to an input of the CMOS circuit; and timing the transfer such that the output signal is stable at the input of the CMOS circuit for at least a specified setup time before a clock edge of the CMOS circuit and remains stable for at least a specified hold time after the clock edge.

20. The method of claim 17, comprising:

transferring a signal from a CMOS circuit to a quasi-adiabatic logic circuit, including:

generating an output signal at an output of the CMOS circuit;

providing the output signal to an input node of one of the plurality of quasi-adiabatic logic gates; and timing the transfer such that the output signal is stable at the input node during a setup phase of the respective one of the plurality of clock signals driving the one of the plurality of quasi-adiabatic logic gates and remains stable at the input node for at least a hold time after the setup phase.

* * * * *